United States Patent
Kobayashi et al.

(10) Patent No.: US 8,581,652 B2
(45) Date of Patent: Nov. 12, 2013

(54) FLIP-FLOP CIRCUIT, SEMICONDUCTOR DEVICE AND ELECTRONIC APPARATUS

(75) Inventors: Kazutoshi Kobayashi, Kyoto (JP); Jun Furuta, Kyoto (JP); Hidetoshi Onodera, Shiga (JP)

(73) Assignee: National University Corporation Kyoto Institute of Technology, Kyoto (JP)

( * ) Notice: Subject to any disclaimer, the term of this patent is extended or adjusted under 35 U.S.C. 154(b) by 0 days.

(21) Appl. No.: 13/702,638

(22) PCT Filed: Jun. 8, 2011

(86) PCT No.: PCT/JP2011/063154
§ 371 (c)(1),
(2), (4) Date: Dec. 7, 2012

(87) PCT Pub. No.: WO2011/155532
PCT Pub. Date: Dec. 15, 2011

(65) Prior Publication Data
US 2013/0082757 A1    Apr. 4, 2013

(30) Foreign Application Priority Data
Jun. 11, 2010 (JP) ................... 2010-134066

(51) Int. Cl.
*H03K 3/289* (2006.01)

(52) U.S. Cl.
USPC ........................................ 327/202

(58) Field of Classification Search
USPC .......... 327/199–206, 208–212, 214, 215, 218
See application file for complete search history.

(56) References Cited

U.S. PATENT DOCUMENTS

| 2006/0082404 A1 | 4/2006 | Ishii et al. |
| 2009/0039937 A1 | 2/2009 | Ishii et al. |
| 2010/0052756 A1* | 3/2010 | Tang ............................. 327/203 |

FOREIGN PATENT DOCUMENTS

| JP | 2004-095063 A | 3/2004 |
| JP | 2006-115311 A | 4/2006 |

OTHER PUBLICATIONS

International Search Report for corresponding International Application No. PCT/JP2011/063154 mailed Jul. 12, 2011.
Form PCT/ISA/237 for corresponding International Application No. PCT/JP2011/063154 dated Jul. 12, 2011.
Furuta et al., "An Area/Delay Efficient Dual-Modular Flip-Flop with Higher SEU/SET Immunity", The 22nd Workshop on Circuits and Systems in Karuizawa, Apr. 2009, p. 456-461 and partial English translation.
Furuta et al., "An Area/Delay Efficient Dual-Modular Flip-Flop with Higher SEU/SET Immunity", IEICE Trans. Electron., vol. E93-C, No. 3, Mar. 2010, p. 340-346.

(Continued)

*Primary Examiner* — Lincoln Donovan
*Assistant Examiner* — Sibin Chen
(74) *Attorney, Agent, or Firm* — Renner, Otto, Boisselle & Sklar, LLP

(57) ABSTRACT

A flip-flop circuit (FF 10) of the present invention includes master latch circuits (LAT 11 and LAT 12), slave latch circuits (LAT 13 and LAT 14), C-element circuits (CE 11, CE 12, CE 13, and CE 14), and inverter circuits (INV 11, INV 12, INV 13, and INV 14). The inverter circuits (INV 11 and INV 12) are interconnected to each other between the C-element circuit (CE 11) and the C-element circuit (CE 12). The inverter circuits (INV 13 and INV 14) are interconnected to each other between the C-element circuit (CE 13) and the C-element circuit (CE 14).

20 Claims, 21 Drawing Sheets

(56) References Cited

OTHER PUBLICATIONS

Furuta et al., "A 65nm Bistable Cross-coupled Dual Modular Redundancy Flip-Flop Capable of Protecting Soft Errors on the C-element", 2010 Symposium on VLSI Circuits/Technical Digest of Technical Papers, p. 123-124.

Furuta et al., "A 65nm Flip-Flop Array to Measure Soft Error Resiliency against High-Energy Neutron and Alpha Particles", ASP-DAC, 2011, p. 83-84.

Yamamoto et al., "An Area-Efficient 65nm Radiation-hard Dual-Modular Flip-Flop to Avoid Multiple Cell Upsets", IEEE Trans. On Nuclear Science, vol. 58, No. 6, Dec. 2011, p. 3053-3059.

Zhang et al., "Device-level Simulations of Parasitic Bipolar Mechanism on Preventing MCUs of Redundant Flip-Flops", SASIMI 2012 Proceedings, p. 330-333.

Zhang et al., "Parasitic Bipolar Effects on Soft Errors to Prevent Simultaneous Flips of Redundant Flip-Flops", IRPS 2012, p. 5B.2.1-5B.2.4.

Hamanaka et al., "Variation-Tolerance of a 65-nm Error-Hardened Dual-Modular-Redundancy Flip-Flop Measured by Shift-Register-Based Monitor Structures", IEICE trans. Fundamentals, vol. E94-A, No. 12, Dec. 2011, p. 2669-2675.

Masuda et al., "A 65 nm Low-Power Adaptive-Coupling Redundant Flip-Flops", RADECS, 2012, p. 14.

* cited by examiner

| | FF70 (DMR) | | | FF10 (BCDMR) | | |
|---|---|---|---|---|---|---|
| | Area | Delay | Power | Area | Delay | Power |
| 1.2V | 3.00 | 1.47 | 2.15 | 3.00 | 1.45 | 2.20 |
| 0.5V | 3.00 | 1.96 | 2.39 | 3.00 | 1.57 | 2.23 | ps
FLIP-FLOP CIRCUIT, SEMICONDUCTOR DEVICE AND ELECTRONIC APPARATUS

TECHNICAL FIELD

The present invention relates to a flip-flop circuit which is increased in resistance to a soft error.

BACKGROUND ART

The more delicate a process has become, the more the number of transient errors has become. A typical example of such a transient error is a soft error. A soft error was a problem related to outer space or an SRAM. However, recently, even on earth, it has become necessary to have countermeasures against a soft error. A main cause of generation of a soft error on earth is a high-energy neutron.

As illustrated in FIG. 9, a collision of a high-energy neutron against an Si atom of a substrate generates a secondary ion. In a case where the secondary ion passes by a diffusion layer, electrons or holes gather in the diffusion layer because of (i) diffusion or (ii) occurrence of a drift due to an electric field of a depletion layer. Such electrons or holes change an electric charge of a drain, and, as a result, an output is inverted.

Depending on where a collision of a high-energy neutron occurs, a soft error is classified into the following three types: SEU (Single Event Upset), SET (Single Event Transient), and MCU (Multiple Cell Upset). SEU is such an error that a high-energy neutron collides with an FF (flip-flop) or an SRAM and therefore directly inverts retained data (see (a) of FIG. 10). SET is such an error that a high-energy neutron collides with a combinational circuit and therefore generates a pulse (see (b) of FIG. 10). MCU is such an error that, in an SRAM having a high integration degree, a plurality of pieces of data, retained by a plurality of SRAMs, are inverted at one time (see (c) of FIG. 10).

An error ratio of an FF due to SEU has increased up to approximately 1e-3 FIT. "FIT" is an expected value of the number of times that an error occurs in 1e9 hour. In a case where a chip employing one million FFs is used, one error might occur in approximately 100 years. Note that an FF and an SRAM are identical with each other in an error ratio due to SEU.

In the case of SET, an error occurs in such a manner that a pulse is taken by a latch circuit. As such, an error ratio due to SET is smaller than the error ratio due to SEU. However, in order to build a circuit having a high resistance to a soft error, it is necessary to have countermeasures against not only an error due to SEU but also an error due to SET. A dual modular FF employing a redundant FF is used in order to reduce error ratios due to SEU and SET. Examples of a circuit configuration employing the multiple modular FF encompass a TMR (Triple Modular Redundancy) and a delay insertion TMR (DTMR).

FIG. 11 is a view illustrating a configuration of a flip-flop circuit FF 50, which is a general TMR. The flip-flop circuit FF 50 includes (i) three master latch circuits LAT 51, LAT 52, and LAT 53, (ii) three slave latch circuits LAT 54, LAT 55, and LAT 56, (iii) three majority circuits VOT 51, VOT 52, and VOT 53, and (iv) a single inverter circuit INV 51. Input terminals of the master latch circuits LAT 51, LAT 52, and LAT 53 receive input data IN 0, input data IN 1, and input data IN 2, respectively, which are supplied from three combinational circuits COMB 51, COMB 52, and COMB 53, respectively. Further, the slave latch circuits LAT 54, LAT 55, and LAT 56 output output data OUT 0, output data OUT 1, and output data OUT 2, respectively.

As mentioned above, the flip-flop circuit FF 50 has an arrangement in which a combination of a combinational circuit, a master latch circuit, a slave latch circuit, and a majority circuit is triplicated. With the arrangement, an error does not occur unless a plurality of latch circuits are inverted simultaneously. Accordingly, such an arrangement has a high resistance to an error. However, since not only a latch circuit and a majority circuit but also a combinational circuit is triplicated, a circuit size of the flip-flop circuit FF 50 becomes not less than three times larger than that of a general non-redundant FF. That is, the flip-flop circuit FF 50 has a large overhead in area.

FIG. 12 is a view illustrating a configuration of a flip-flop circuit FF 60, which is a general DTMR. The flip-flop circuit FF 60 includes (i) three master latch circuits LAT 61, LAT 62, and LAT 63, (ii) three slave latch circuits LAT 64, LAT 65, and LAT 66, (iii) a single majority circuit VOT 61, (iv) two delay circuits DEL 61 and DEL 62, and (v) a single inverter circuit INV 61. Input data IN is supplied from a combinational circuit COMB 61 to both an input terminal of the master latch circuit LAT 61 and an input terminal of the delay circuit DEL 61. Further, the majority circuit VOT 61 outputs output data OUT.

As mentioned above, the flip-flop circuit FF 60 does not employ an arrangement in which a combinational circuit is triplicated but such an arrangement that an SET pulse generated in the combinational circuit COMB 61 is removed by the two delay circuits DEL 61 and DEL 62. With the arrangement, an SET pulse generated in the majority circuit VOT 61 is also removed by delay circuits located downstream. For this reason, it is not necessary to triplicate the majority circuit VOT 61. Accordingly, a circuit size of the flip-flop circuit FF 60 is smaller than that of the flip-flop circuit FF 50, which is a TMR. However, the flip-flop circuit FF 60 has a problem that the two delay circuits DEL 61 and DEL 62 cause an increase in delay time.

Moreover, since both the flip-flop circuit FF 50 and the flip-flop circuit FF 60 employ a majority circuit, there is a problem that a resistance to an error due to MCU is low. Specifically, in a case where (i) two master latch circuits are inverted among three master latch circuits or (ii) two slave latch circuits are inverted among three slave latch circuits, an output is also inverted.

There has been proposed such a delay insertion DMR (DDMR, BISER) that, in the flip-flop circuit FF 50 or the flip-flop circuit FF 60, a C-element circuit and a weak keeper circuit are employed. (a) of FIG. 13 is a view illustrating a configuration of a flip-flop circuit FF 70, which is a BISER, and (b) of FIG. 13 is a view illustrating a configuration of a C-element circuit of the flip-flop circuit FF 70.

As illustrated in (a) of FIG. 13, the flip-flop circuit FF 70 includes (i) two master latch circuits LAT 71 and LAT 72, (ii) two slave latch circuits LAT 73 and LAT 74, (iii) two C-element circuits CE 71 and CE 72, (iv) two weak keeper circuits WK 71 and WK 72, (v) a single delay circuit DEL 71, and (vi) a single inverter circuit INV 71. Input data IN is supplied from a combinational circuit COMB 71 to both an input terminal of the master latch circuit LAT 71 and an input terminal of the delay circuit DEL 71.

The weak keeper circuit WK 71 is constituted by two inverter circuits INV 72 and INV 73. Similarly, the weak keeper circuit WK 72 is constituted by two inverter circuits INV 74 and INV 75. With the arrangement, the weak keeper circuits WK 71 and WK 72 retain output data supplied from the C-element circuits CE 71 and CE 72, respectively.

As illustrated in (b) of FIG. 13, each of the C-element circuits includes two PMOS transistors MP 1 and MP 2 and two NMOS transistors MN 1 and MN 2. The transistors MP 1 and MP 2 are connected to each other in series between a power-supply electric potential VCC and an output node N 3, and the NMOS transistors MN 1 and MN 2 are connected to each other in series between the output node N 3 and a ground potential VSS. Further, each of gates of the transistors MP 1 and MN 2 is connected to a first input node N 1 of the C-element circuit, and each of gates of the transistors MP 2 and MN 1 is connected to a second input node N 2 of the C-element circuit. With the arrangement, in a case where a value inputted into the input node N 1 and a value inputted into the input node N 2 are different from each other, the C-element circuit retains an immediately previous value.

Accordingly, with the flip-flop circuit FF 70, an error does not occur even in a case where one of data retained by the master latch circuit LAT 71 and data retained by the master latch circuit LAT 72 is inverted. Further, an SET pulse generated in the combinational circuit COMB 71 is removed by the delay circuit DEL 71. Furthermore, since (i) a circuit size of the flip-flop circuit FF 70 is smaller than that of a DTMR, and (ii) the flip-flop circuit FF 70 has a single delay circuit, a delay time is not as much as that of the DTMR.

However, the flip-flop circuit FF 70 illustrated in FIG. 13 has such a disadvantage that the flip-flop circuit FF70 is vulnerable to an error due to an SET pulse generated in the C-element circuit. Specifically, as illustrated in FIG. 14, in a case where a high-energy neutron collides with the C-element circuit and generates an SET pulse, such an SET pulse is latched by both the two slave latch circuits LAT 73 and LAT 74. This causes an output of the downstream C-element circuit CE 72 to be inverted. Further, the flip-flop circuit FF 70 has such a problem that, although a resistance to an error is high when a clock frequency is low, a resistance to an error decreases with an increase in clock frequency.

In view of these, the inventors of the present invention has proposed a $D^3MR$ (Double Delayed DMR) and an $ED^2MR$ (Enhanced Delayed DMR) as a DMR which is further improved in resistance to an error (Non-Patent Literature 1).

FIG. 15 is a view illustrating a configuration of a flip-flop circuit FF 80, which is a $D^3MR$. The flip-flop circuit FF 80 has such an arrangement that, in the flip-flop circuit FF 70 illustrated in FIG. 13, a delay circuit DEL 81 is provided upstream of an input terminal of the slave latch circuit LAT 74. With the arrangement, it is possible to remove an SET pulse generated in the C-element circuit CE 71 by use of the delay circuit DEL 81.

FIG. 16 is a view illustrating a configuration of a flip-flop circuit FF 90, which is an $ED^2MR$. The flip-flop circuit FF 90 has such an arrangement that, in the flip-flop circuit FF 70 illustrated in FIG. 13, (i) a C-element circuit CE 91 and a weak keeper circuit WK 91 are further included, (ii) the C-element circuit CE 71 and the weak keeper circuit WK 71 are connected to the slave latch circuit LAT 73, and (iii) the C-element circuit CE 91 and the weak keeper circuit WK 91 are connected to the slave latch circuit LAT 74. The weak keeper circuit WK 91 is constituted by two inverter circuits INV 91 and INV 92, in the same manner as the weak keeper circuits WK 71 and WK 72.

The flip-flop circuit FF 90 has an arrangement in which a combination of a C-element circuit and a weak keeper circuit, provided between master latch circuits and slave latch circuits, are duplicated. With the arrangement, even in a case where an SET pulse is generated in one of the C-element circuits CE 71 and CE 91, an output of the downstream C-element circuit CE 72 is not inverted. This makes it possible to increase a resistance to an error due to an SET pulse generated in the C-element circuit.

CITATION LIST

Non-Patent Literature

[Non-Patent Literature 1]
Jun FURUTA, Kazutoshi KOBAYASHI, Hidetoshi ONODERA, "An area/delay efficient dual-modular flip-flop with higher SEU/SET immunity," The 22nd Workshop on Circuits and Systems in Karuizawa, April 2009, p. 456-461

SUMMARY OF INVENTION

Technical Problem

However, since the flip-flop circuit FF 80 illustrated in FIG. 15 has an arrangement in which an additional delay circuit is further provided in the arrangement of the flip-flop circuit FF 70 illustrated in FIG. 13, there is a problem of a large overhead in circuit area.

The flip-flop circuit FF 90 illustrated in FIG. 16 can remove an SET pulse generated in the C-element circuit without an increase in delay time, as compared with the flip-flop circuit FF 70 illustrated in FIG. 13. However, since the C-element circuit CE 91 and the weak keeper circuit WK 91 are additionally provided, there is a problem of a large overhead in circuit area.

Furthermore, a conventional flip-flop circuit has a problem that a delay time varies greatly due to variations of transistors constituting a C-element circuit and a weak keeper circuit, which variations are caused in a manufacturing process. FIG. 17 is a graph showing (i) variations of a delay time of the flip-flop circuit FF 70 illustrated in FIG. 13 and (ii) variations of a delay time of the flip-flop circuit FF 90 illustrated in FIG. 16. FIG. 17 is such a graph that variations of a delay time are evaluated by use of Monte Carlo simulation, which variations are caused by differences (generated in manufacturing process) in gate length of transistors constituting the C-element circuit and the weak keeper circuit. The evaluation is obtained on a premise that (i) the transistors vary in gate length in accordance with a normal distribution ($1\sigma=1$ nm), and (ii) a power-supply voltage is 1.2 V. A horizontal axis of the graph shows normalization carried out by setting an average delay time of the flip-flop circuits FF 70/FF 90 to be 1. The delay time of the flip-flop circuit FF 70 is distributed in a range of ±3%, and the delay time of the flip-flop circuit FF 90 is distributed in a range of ±2.5%.

The present invention is made in view of the problems mentioned above. An object of the present invention is to provide a flip-flop circuit which (i) can have a significant reduction in circuit area and (ii) has a reduction in variations of a delay time.

Solution to Problem

In order to attain the object, a flip-flop circuit of the present invention, for retaining input data, includes: a first master latch circuit for latching the input data; a second master latch circuit for latching the input data; a first C-element circuit for receiving an inverted output of the first master latch circuit and an inverted output of the second master latch circuit; a second C-element circuit for receiving a non-inverted output of the first master latch circuit and a non-inverted output of the second master latch circuit; a first slave latch circuit for latching an output of the first C-element circuit; a second slave latch circuit for latching an output of the second C-element circuit; a third C-element circuit for receiving an inverted output of the first slave latch circuit and an inverted output of the second slave latch circuit; a fourth C-element circuit for receiving a non-inverted output of the first slave latch circuit and a non-inverted output of the second slave latch circuit; a first inverter circuit; a second inverter circuit being interconnected to the first inverter circuit; a third inverter circuit; and a fourth inverter circuit being interconnected to the third inverter circuit, an input terminal of the first inverter circuit and an output terminal of the second inverter circuit being connected to a connection point between an output terminal of the first C-element circuit and a data input terminal of the first slave latch circuit, an output terminal of the first inverter circuit and an input terminal of the second inverter circuit being connected to a connection point between an output terminal of the second C-element circuit and a data input terminal of the second slave latch circuit, an input terminal of the third inverter circuit and an output terminal of the fourth inverter circuit being connected to an output terminal of the third C-element circuit, an output terminal of the third inverter circuit and an input terminal of the fourth inverter circuit being connected to an output terminal of the fourth C-element circuit.

According to the arrangement, the first C-element circuit retains immediately previous data, in a case where a value of the inverted output of the first master latch circuit and a value of the inverted output of the second master latch circuit are different from each other. Further, the second C-element circuit retains immediately previous data, in a case where a value of the non-inverted output of the first master latch circuit and a value of the non-inverted output of the second master latch circuit are different from each other. Accordingly, even if one of the output of the first master latch circuit and the output of the second master latch circuit is inverted due to a soft error, the output of the first C-element circuit and the output of the second C-element circuit are not inverted. That is, the first inverter circuit and the second inverter circuit have both (i) a function of a weak keeper circuit for the output of the first C-element circuit, and (ii) a function of a weak keeper circuit for the output of the second C-element circuit. Accordingly, it is possible to have a reduction in circuit area, as compared with a conventional arrangement in which weak keeper circuits are provided for the first C-element circuit and the second C-element circuit, respectively.

Similarly, the third C-element circuit retains immediately previous data, in a case where a value of the inverted output of the first slave latch circuit and a value of the inverted output of the second slave latch circuit are different from each other. Further, the fourth C-element circuit retains immediately previous data, in a case where a value of the non-inverted output of the first slave latch circuit and a value of the non-inverted output of the second slave latch circuit are different from each other. Accordingly, even if one of the output of the first slave latch circuit and the output of the second slave latch circuit is inverted due to a soft error, the output of the third C-element circuit and the output of the fourth C-element circuit are not inverted. That is, the third inverter circuit and the fourth inverter circuit have both (i) a function of a weak keeper circuit for the output of the third C-element circuit, and (ii) a function of a weak keeper circuit for the output of the fourth C-element circuit. Accordingly, it is possible to have a reduction in circuit area, as compared with a conventional arrangement in which weak keeper circuits are provided for the third C-element circuit and the fourth C-element circuit, respectively.

Further, even if one of the output of the first C-element circuit and the output of the second C-element circuit is inverted due to a soft error, it is possible to prevent the output thus inverted from being latched by the first slave latch circuit or the second slave latch circuit. Similarly, even if one of the output of the third C-element circuit and the output of the fourth C-element circuit is inverted due to a soft error, it is possible to prevent the output thus inverted from being outputted from the flip-flop circuit.

Furthermore, with a data retention circuit constituted by inverter circuits which are interconnected to each other, it is easy to rewrite retention data, as compared with conventional weak keeper circuits which are connected to duplicated C-element circuits, respectively. For this reason, it becomes possible to have a reduction in a size of each of transistors constituting the first C-element circuit, the second C-element circuit, the third C-element circuit, and the fourth C-element circuit, as compared with a size of each of transistors constituting a C-element circuit of a conventional flip-flop circuit. Accordingly, with the flip-flop circuit of the present invention, it is possible to have a further reduction in circuit area, as compared with the conventional flip-flop circuit.

With the data retention circuit constituted by the inverter circuits which are interconnected to each other, it is easy to rewrite retention data, as compared with conventional weak keeper circuits which are connected to duplicated C-element circuits, respectively. For this reason, there is a small influence on a delay time, even if a gate length or a threshold value of each of the transistors constituting the weak keeper circuits is changed due to variations of such transistors.

Moreover, since it is easy to rewrite retention data, it is unnecessary to have a reduction in a size of each of transistors constituting the weak keeper circuits. Accordingly, variations of a gate length or a threshold value of each of transistors constituting the weak keeper circuits becomes less, and therefore variations of a delay time become less. Accordingly, it becomes possible to realize a flip-flop circuit which (i) can have a significant reduction in circuit area and (ii) has a reduction in variations of a delay time.

Advantageous Effects of Invention

As described above, a flip-flop circuit of the present invention, for retaining input data, includes: a first master latch circuit for latching the input data; a second master latch circuit for latching the input data; a first C-element circuit for receiving an inverted output of the first master latch circuit and an inverted output of the second master latch circuit; a second C-element circuit for receiving a non-inverted output of the first master latch circuit and a non-inverted output of the second master latch circuit; a first slave latch circuit for latching an output of the first C-element circuit; a second slave latch circuit for latching an output of the second C-element circuit; a third C-element circuit for receiving an inverted output of the first slave latch circuit and an inverted output of the second slave latch circuit; a fourth C-element circuit for receiving a non-inverted output of the first slave latch circuit and a non-inverted output of the second slave latch circuit; a first inverter circuit; a second inverter circuit being interconnected to the first inverter circuit; a third inverter circuit; and a fourth inverter circuit being interconnected to the third inverter circuit, an input terminal of the first inverter circuit and an output terminal of the second inverter circuit being connected to a connection point between an output terminal of the first C-element circuit and a data input terminal of the first slave latch circuit, an output terminal of the first inverter circuit and an input terminal of the second inverter circuit being connected to a connection point between an output terminal of the second C-element circuit and a data input terminal of the second slave latch circuit, an input terminal of the third inverter circuit and an output terminal of the fourth inverter circuit being connected to an output terminal of the third C-element circuit, an output terminal of the third inverter circuit and an input terminal of the fourth inverter circuit being connected to an output terminal of the fourth C-element circuit. Accordingly, it becomes possible to realize a flip-flop circuit which (i) can have a significant reduction in circuit area and (ii) has a reduction in variations of a delay time.

Figures 5, 6:
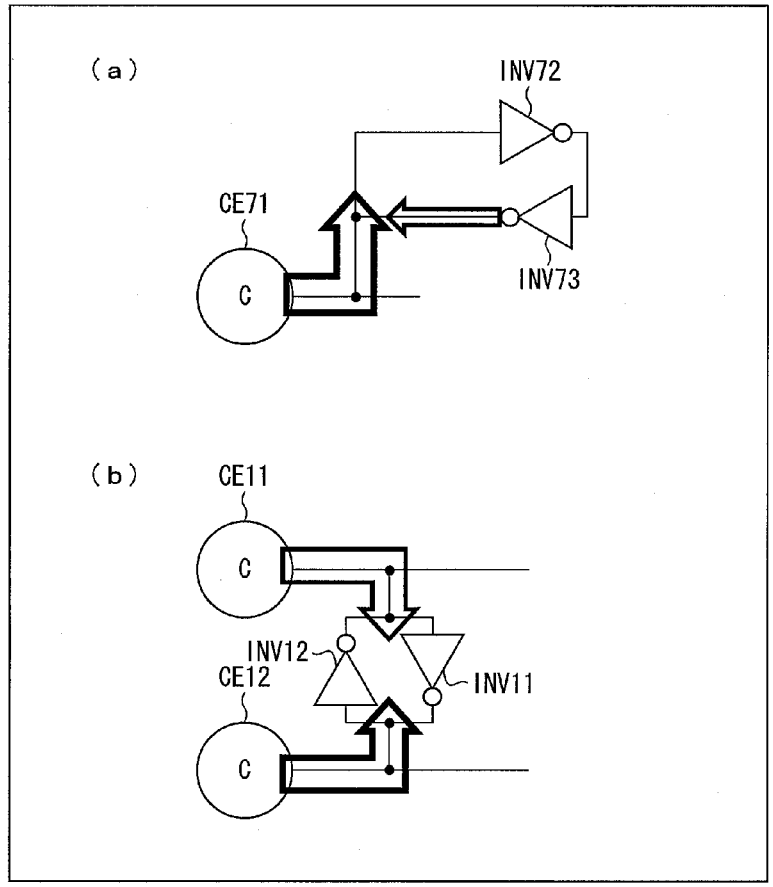
Figure 16:
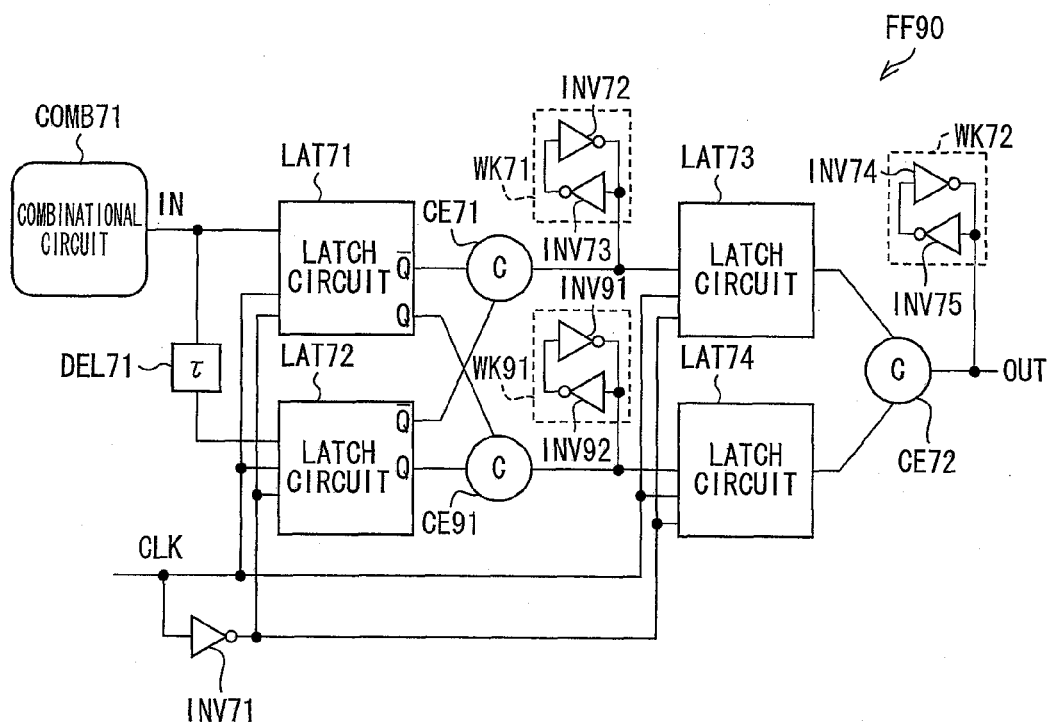

(a) of FIG. 5 is a view illustrating a circuit configuration of a part of a conventional flip-flop circuit illustrated in FIG. 16, and (b) of FIG. 5 is a view illustrating a circuit configuration of a part of the flip-flop circuit of the present embodiment.

Figure 13:
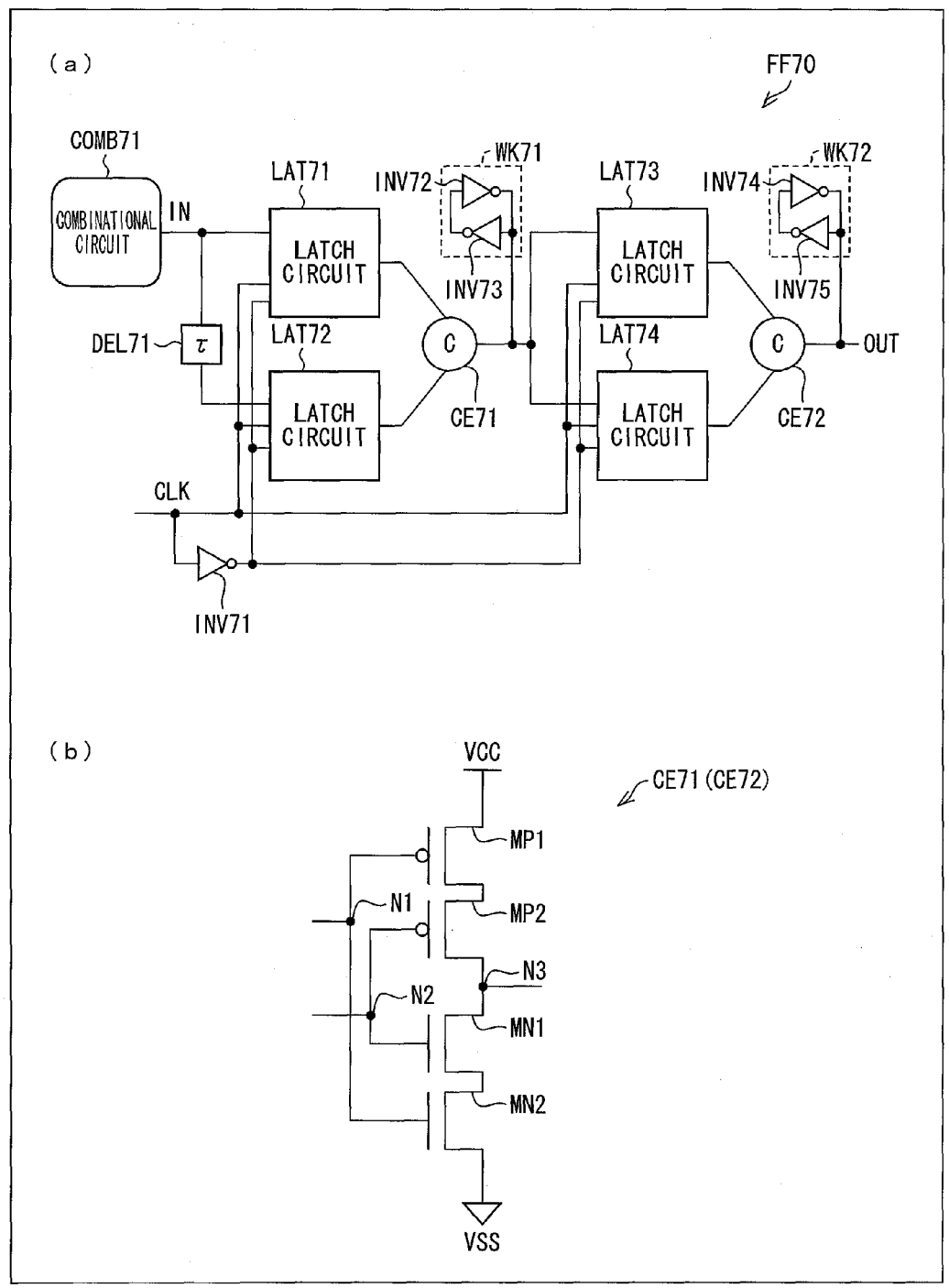

FIG. 6 is a table showing (i) a delay time and an output of a conventional flip-flop circuit illustrated in FIG. 13 with respect to an operating voltage of the conventional flip-flop circuit, and (ii) a delay time and an output of the flip-flop circuit of the present embodiment with respect to an operating voltage of the flip-flop circuit of the present embodiment.

Figure 7:
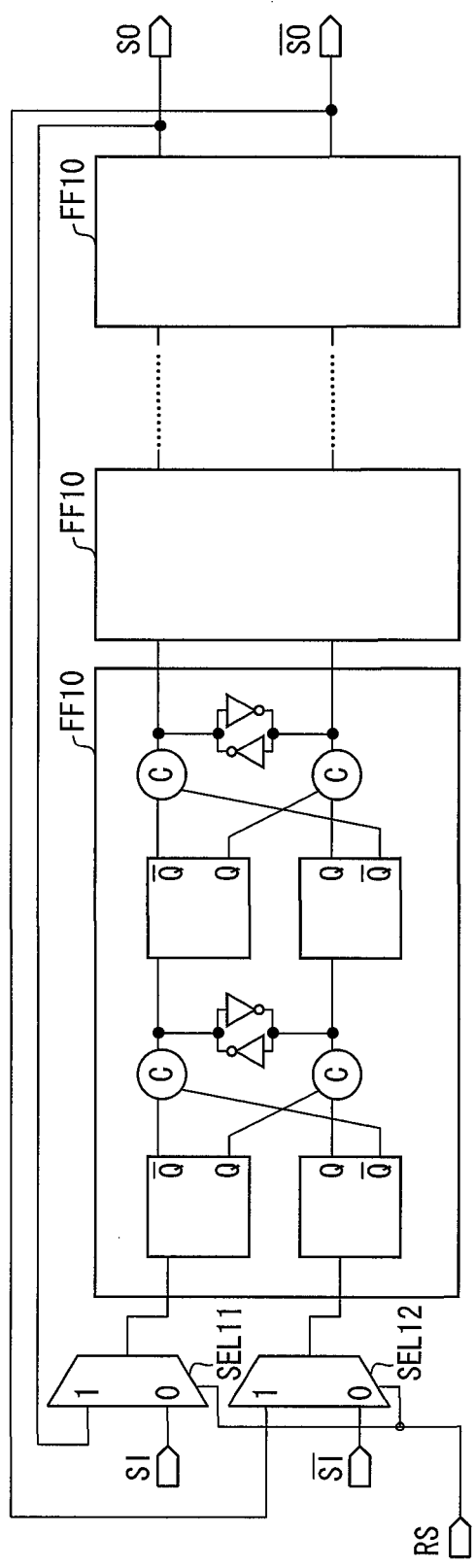

FIG. 7 is a view illustrating a circuit configuration with which a resistance of a flip-flop circuit with respect to an error is measured.

Figure 8:
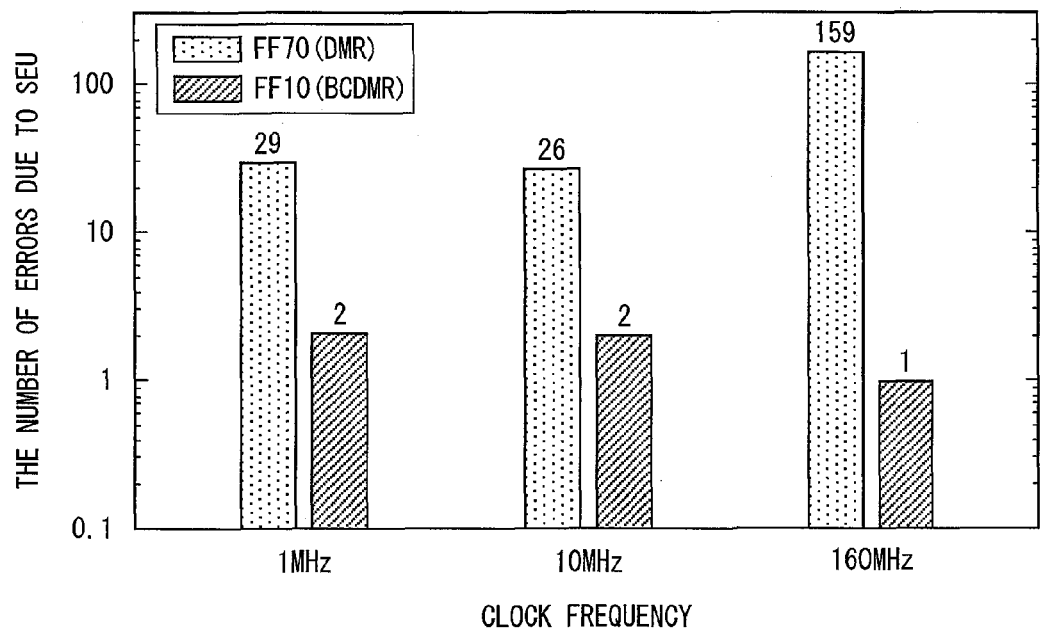

FIG. 8 is a graph showing a relationship between (i) a clock frequency with which a shift operation is performed and (ii) the number of errors due to SEU, counted through approximately 30,000 shift operations.

Figure 9:
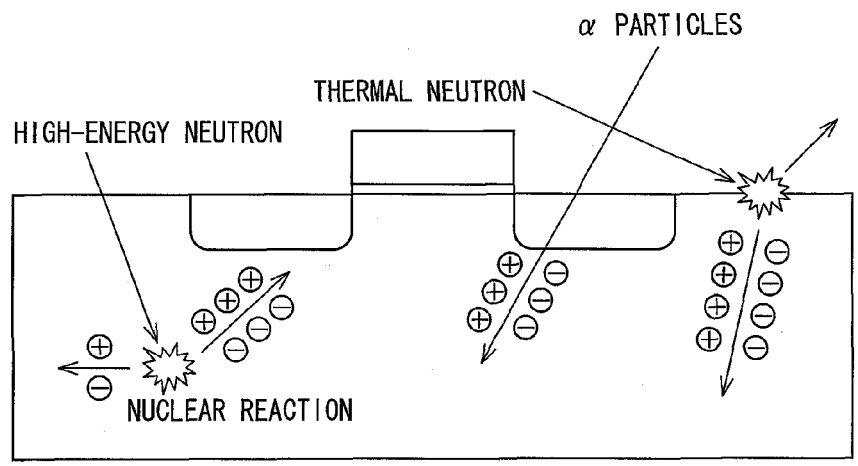

FIG. 9 is a view schematically illustrating generation of a soft error.

Figure 10:
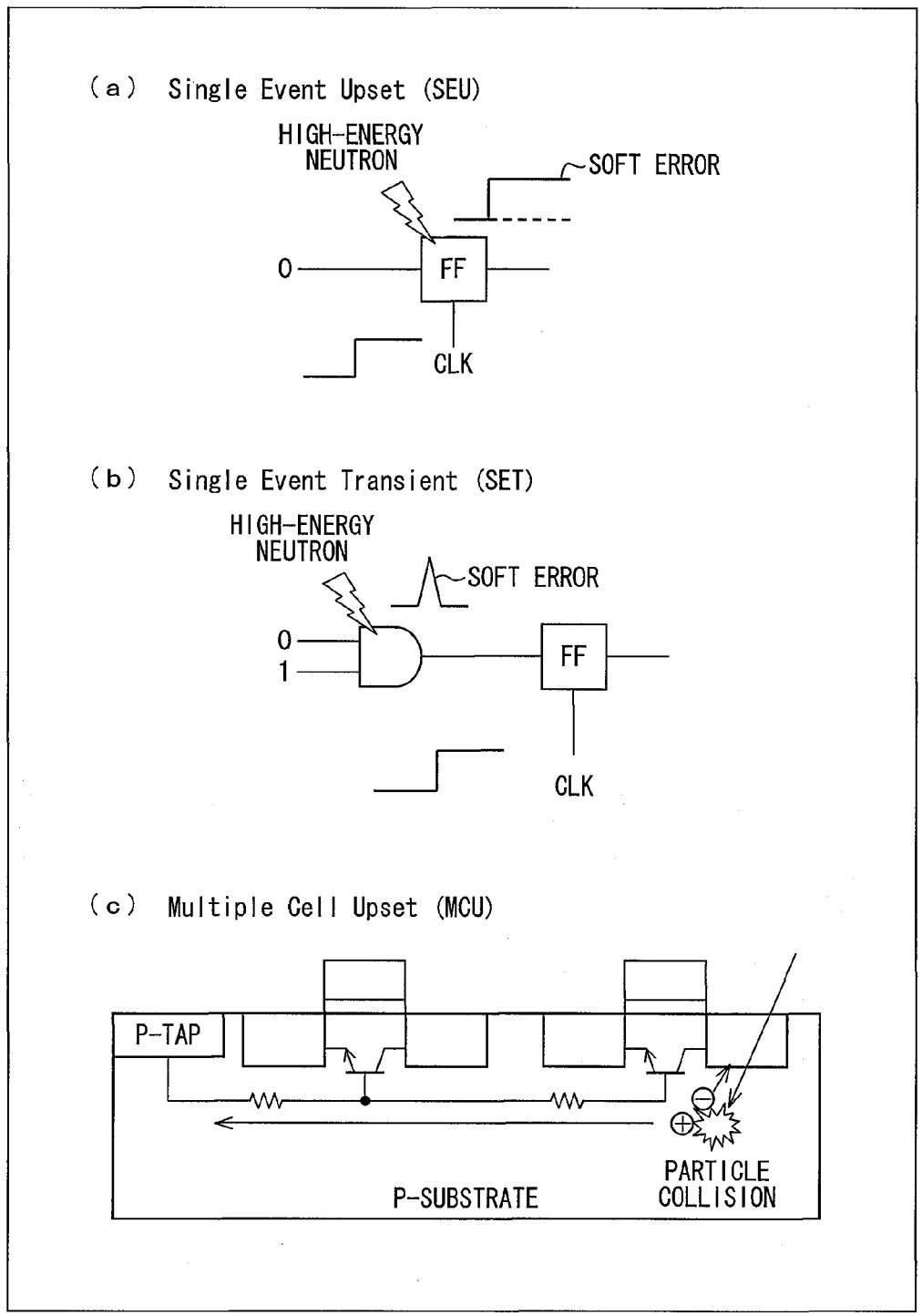

(a) of FIG. 10 is a view illustrating a soft error due to SEU (Single Event Upset), (b) of FIG. 10 is a view illustrating a soft error due to SET (Single Event Transient), and (c) of FIG. 10 is a view illustrating a soft error due to MCU (Multiple Cell Upset).

Figure 11:
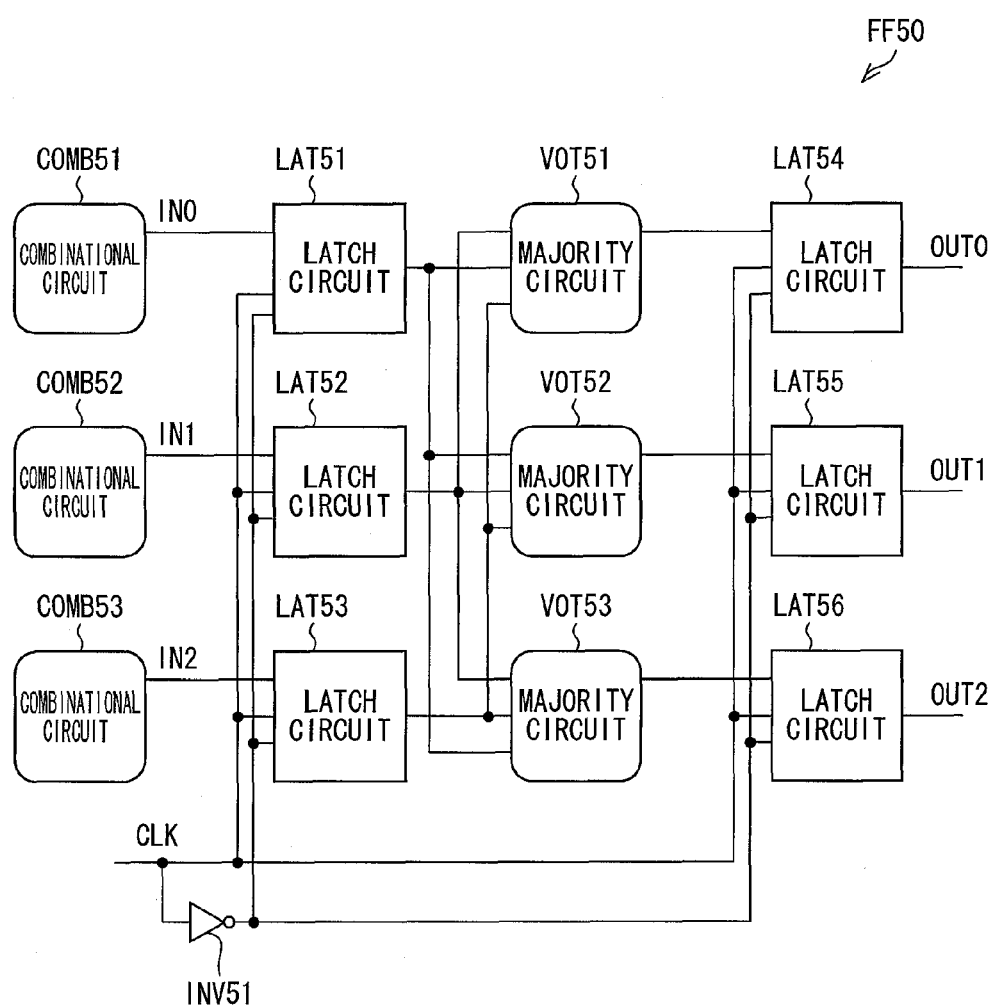

FIG. 11 is a view illustrating a configuration of a conventional flip-flop circuit.

Figure 12:
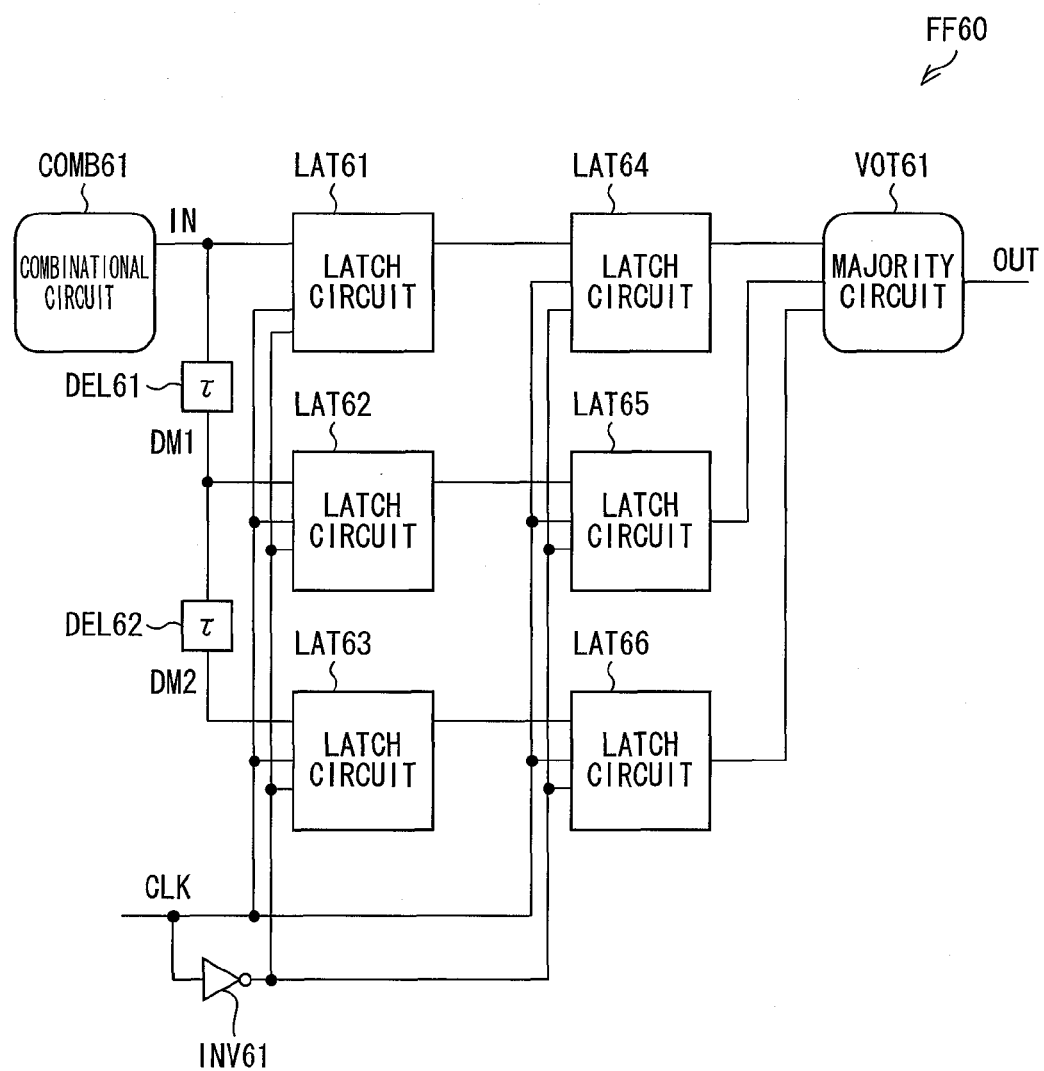

FIG. 12 is a view illustrating a configuration of another conventional flip-flop circuit.

(a) of FIG. 13 is a view illustrating a configuration of further another conventional flip-flop circuit, and (b) of FIG. 13 is a view illustrating a configuration of a C-element circuit of the conventional flip-flop circuit.

Figure 14:
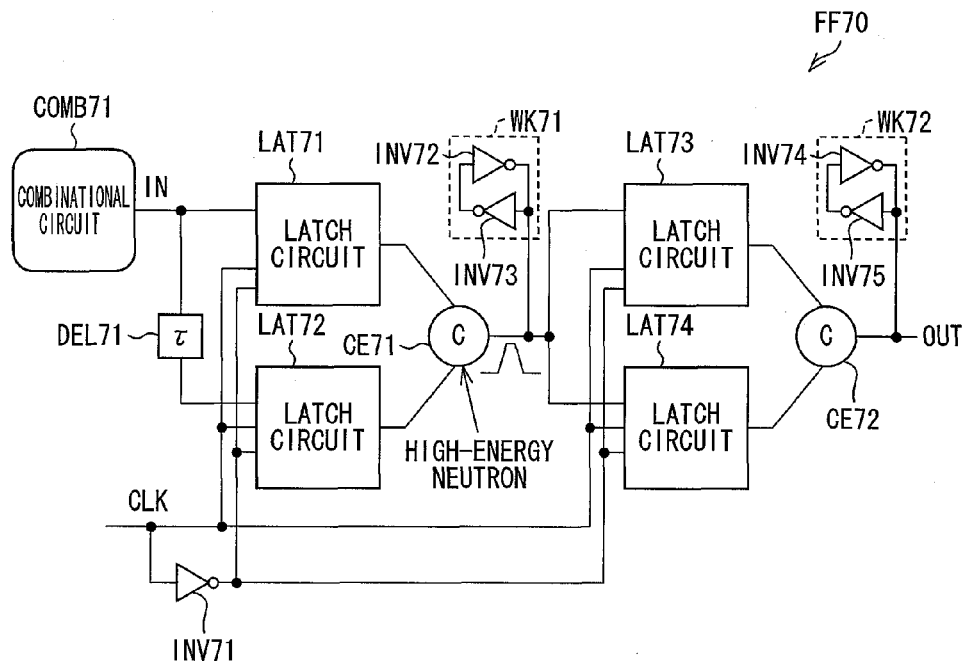

FIG. 14 is a view illustrating a state in which (i) a high-energy neutron collides with the C-element circuit of the conventional flip-flop circuit illustrated in (a) of FIG. 13 and, as a result, (ii) a soft error is generated.

Figure 15:
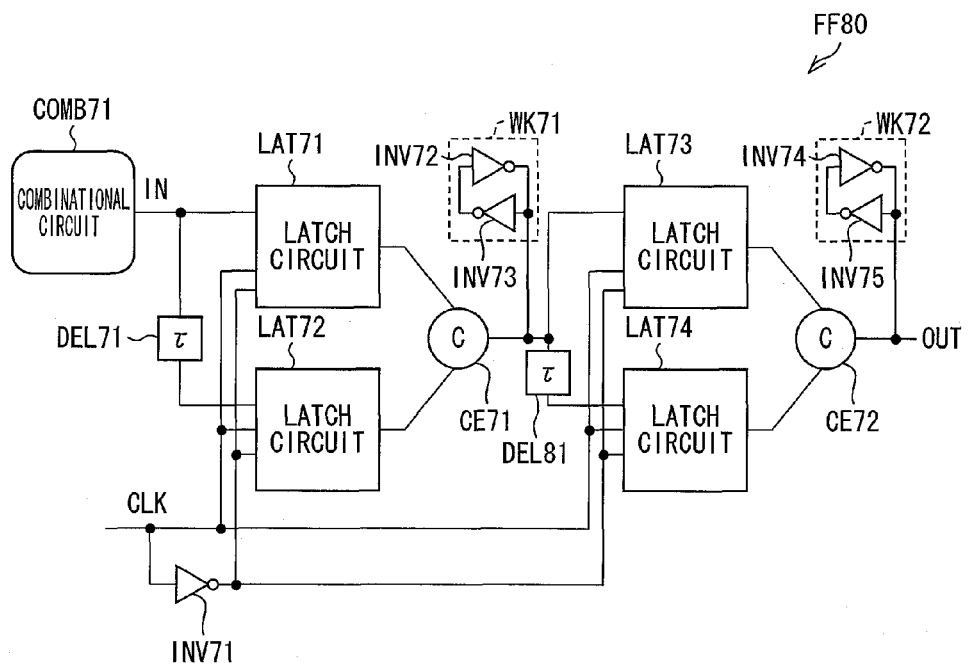

FIG. 15 is a view illustrating a configuration of further another conventional flip-flop circuit.

FIG. 16 is a view illustrating a configuration of further another conventional flip-flop circuit.

Figure 17:
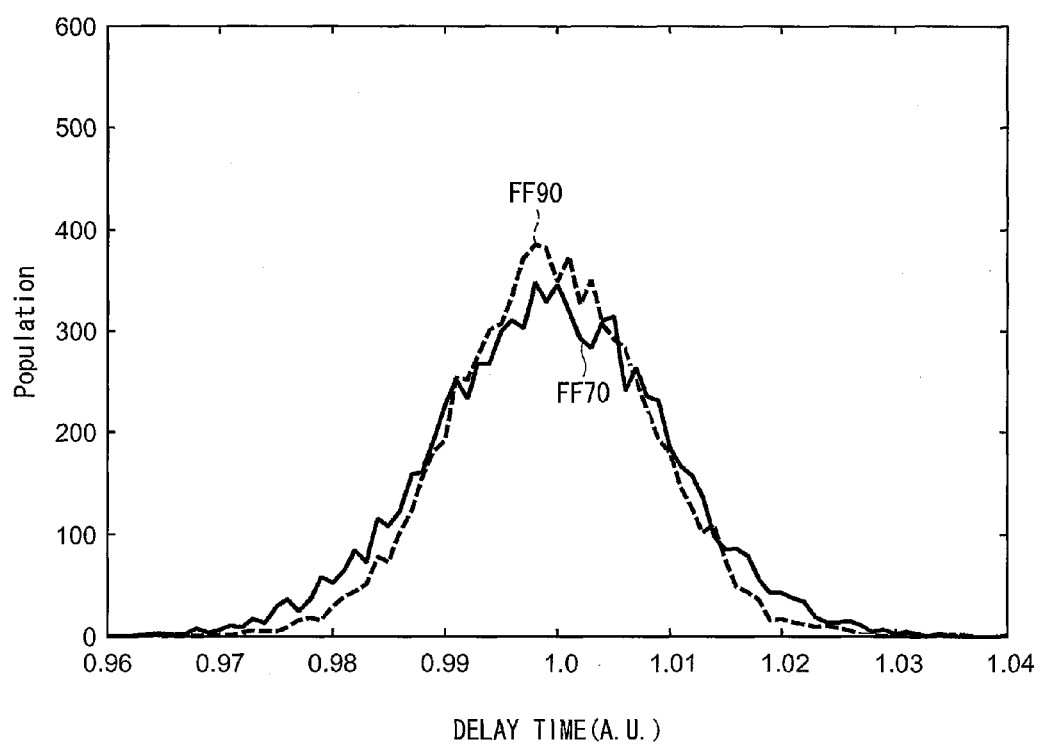

FIG. 17 is a graph showing variations of a delay time of the flip-flop circuit illustrated in FIG. 13 and variations of a delay time of the flip-flop circuit illustrated in FIG. 16.

Figure 18:
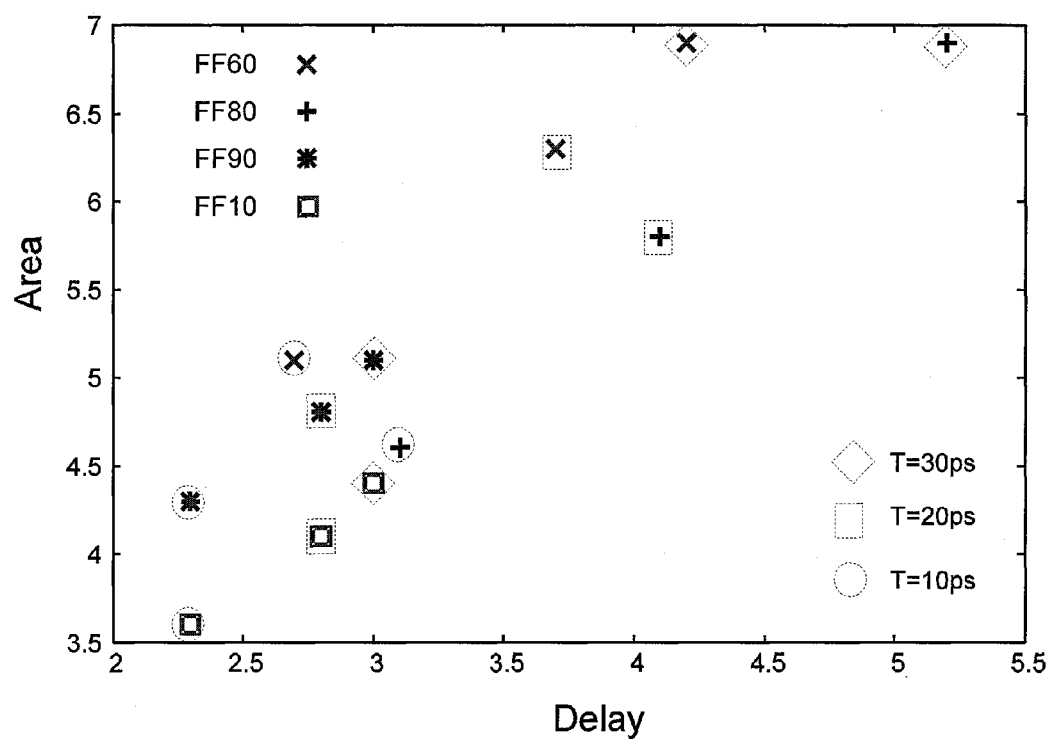

FIG. 18 is a graph showing (i) a relationship between a circuit area of the flip-flop circuit of the present invention and a delay time of the flip-flop circuit of the present invention, and (ii) a relationship between a circuit area of each of conventional flip-flop circuits and a delay time of each of the conventional flip-flop circuits.

Figure 19:
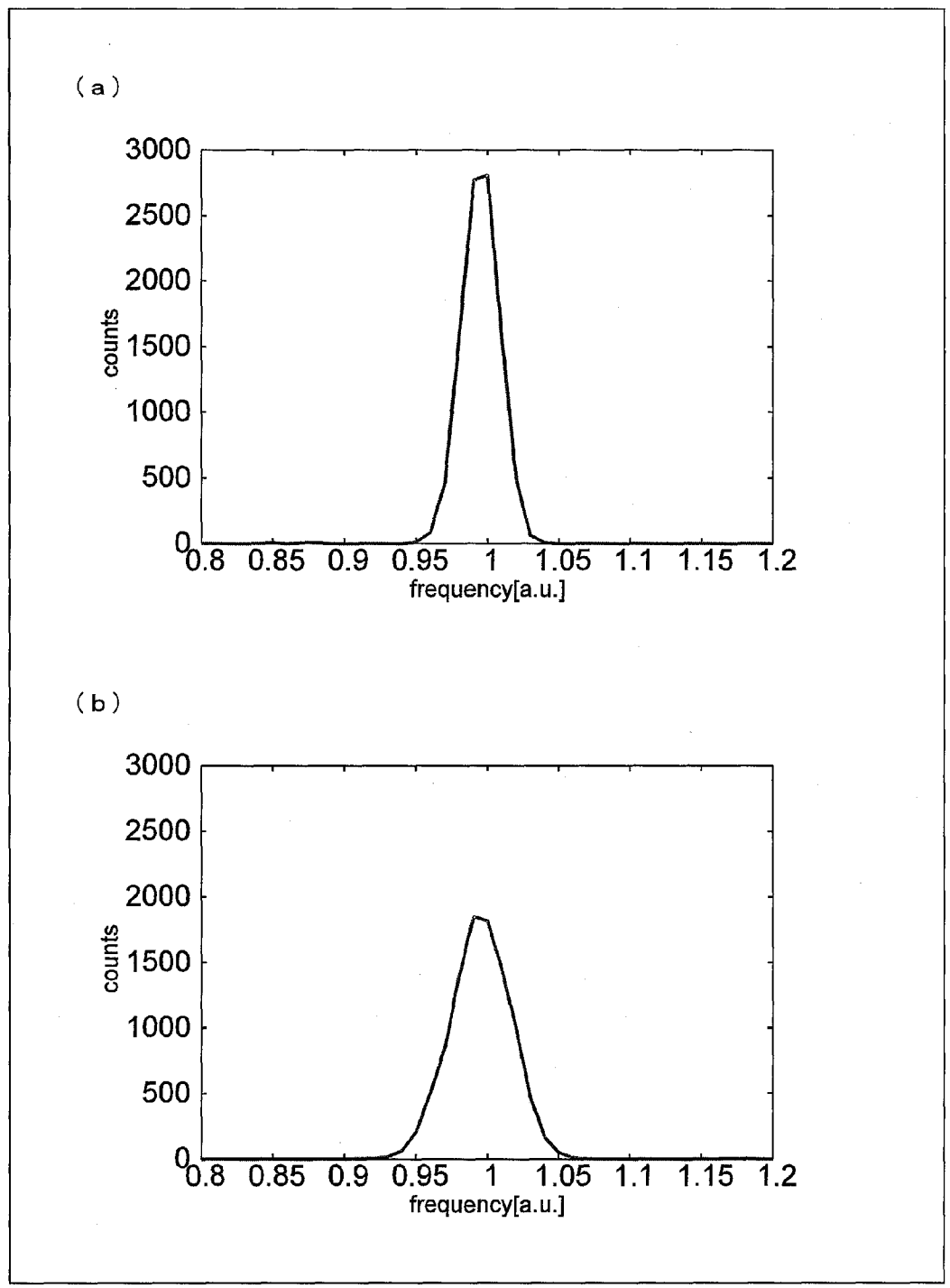

(a) of FIG. 19 is a graph showing variations of an oscillation frequency of an oscillator constituted by the flip-flop circuit of the present invention, and (b) of FIG. 19 is a graph showing variations of an oscillation frequency of an oscillator constituted by a conventional flip-flop circuit.

Figure 1:
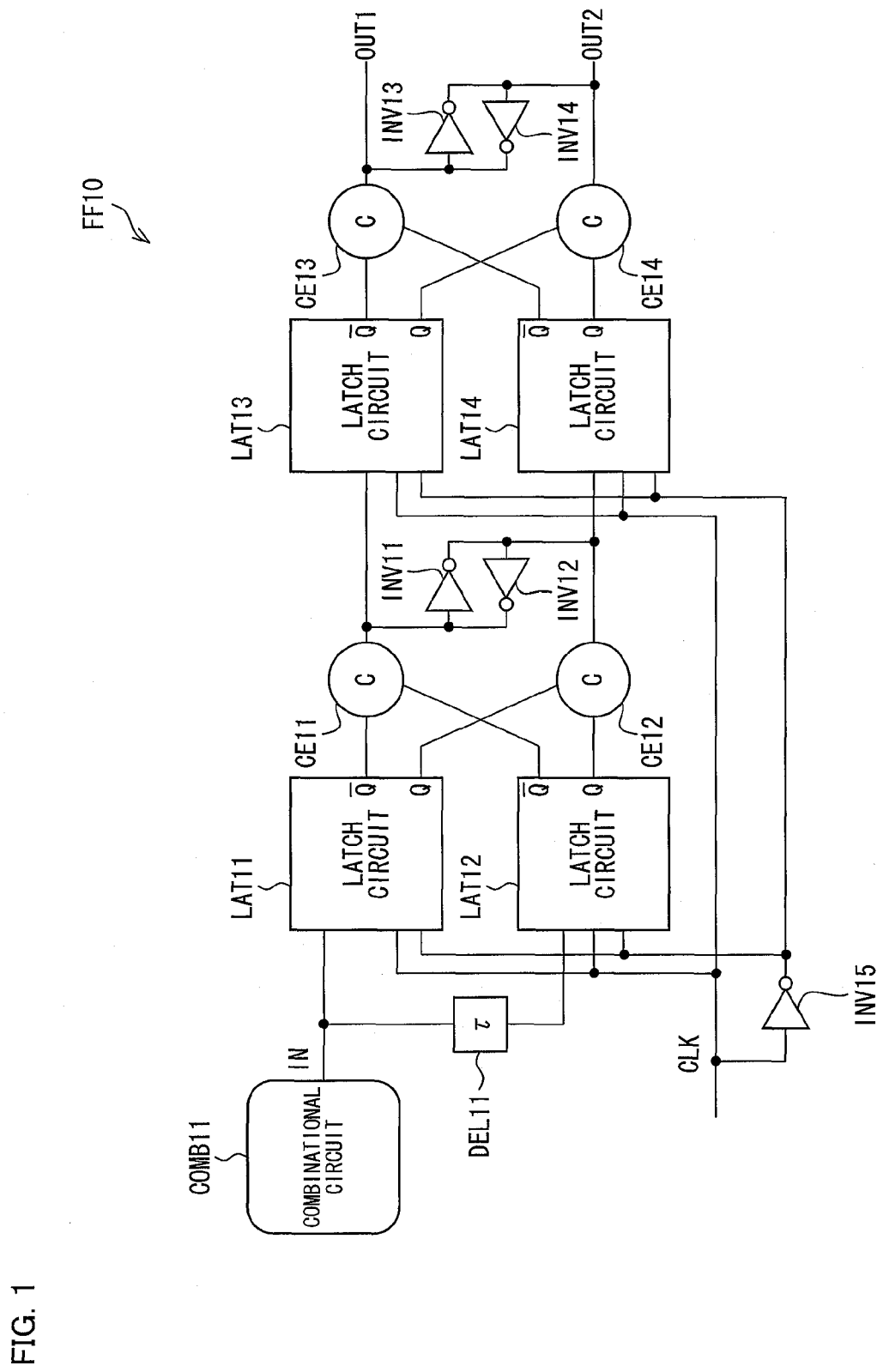
FIG. 1 is a view illustrating a configuration of a flip-flop circuit of Embodiment 1 of the present invention.
Figure 20:
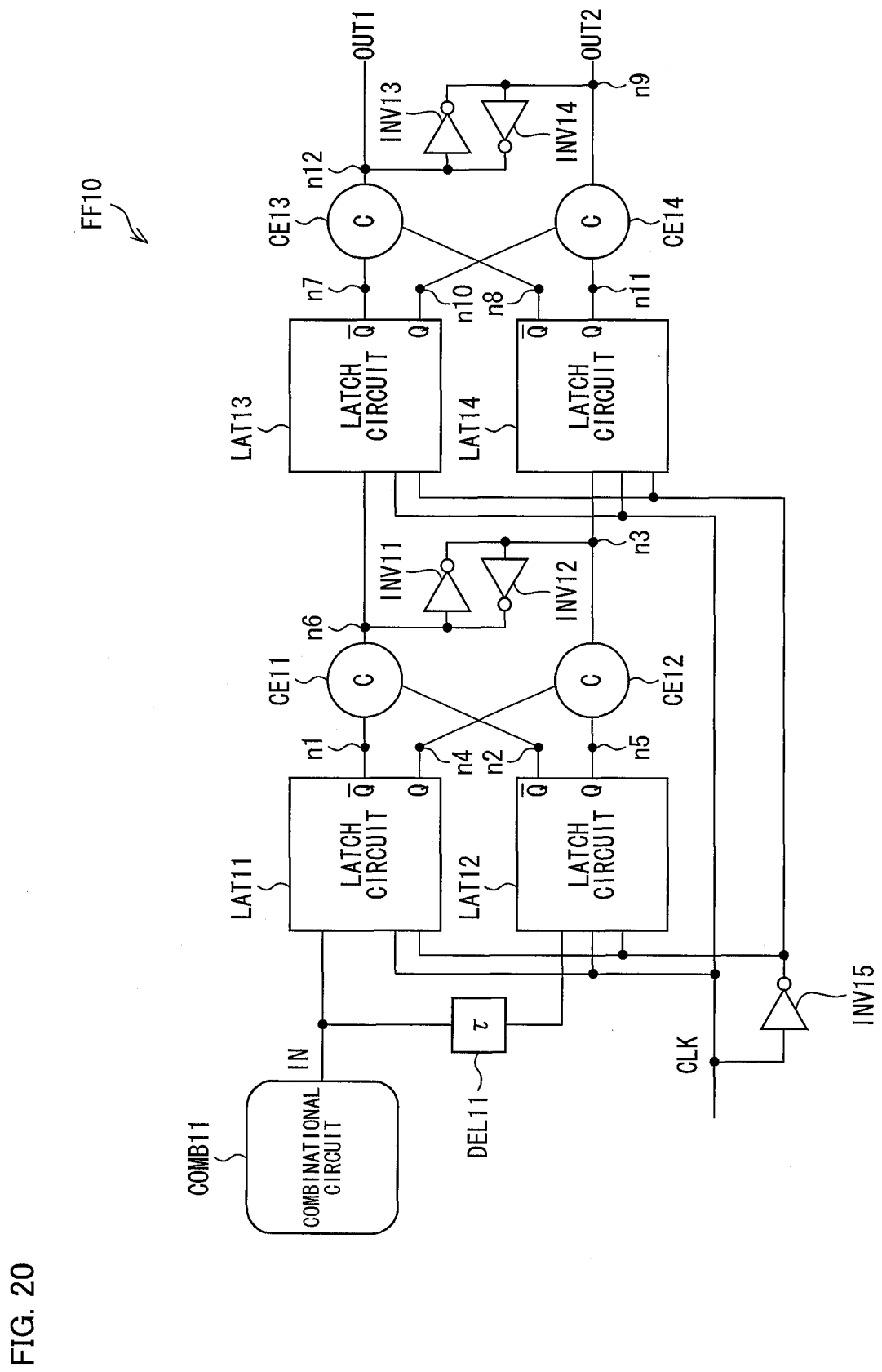

FIG. 20 is a view illustrating sensitive nodes in the flip-flop circuit illustrated in FIG. 1.

Figure 21:
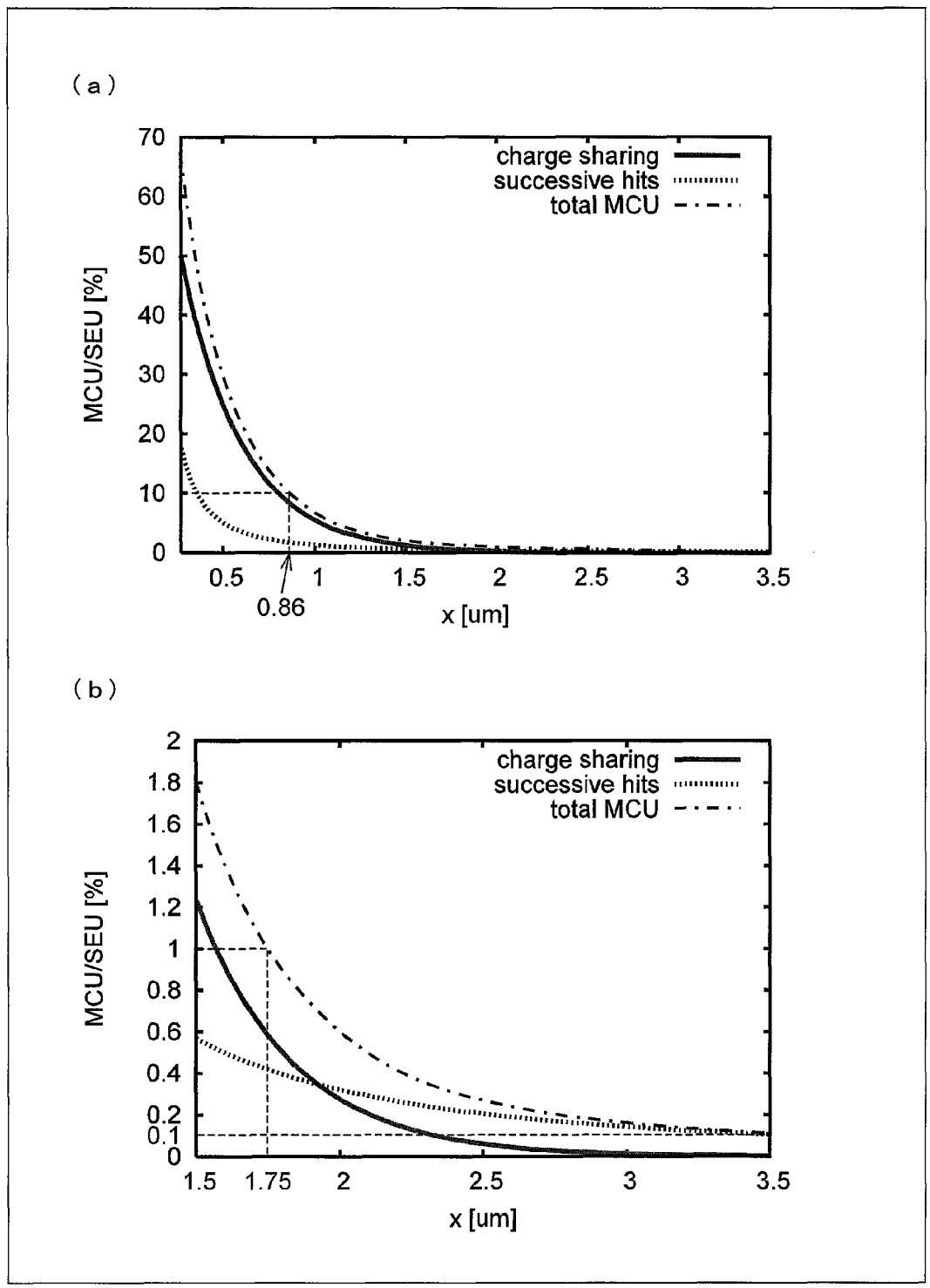

(a) of FIG. 21 is a graph showing a relationship between (i) a distance between sensitive nodes and (ii) an incidence of a soft error, and (b) of FIG. 21 is such a graph that a part of the graph shown in (a) of FIG. 21 is enlarged.

Figure 22:
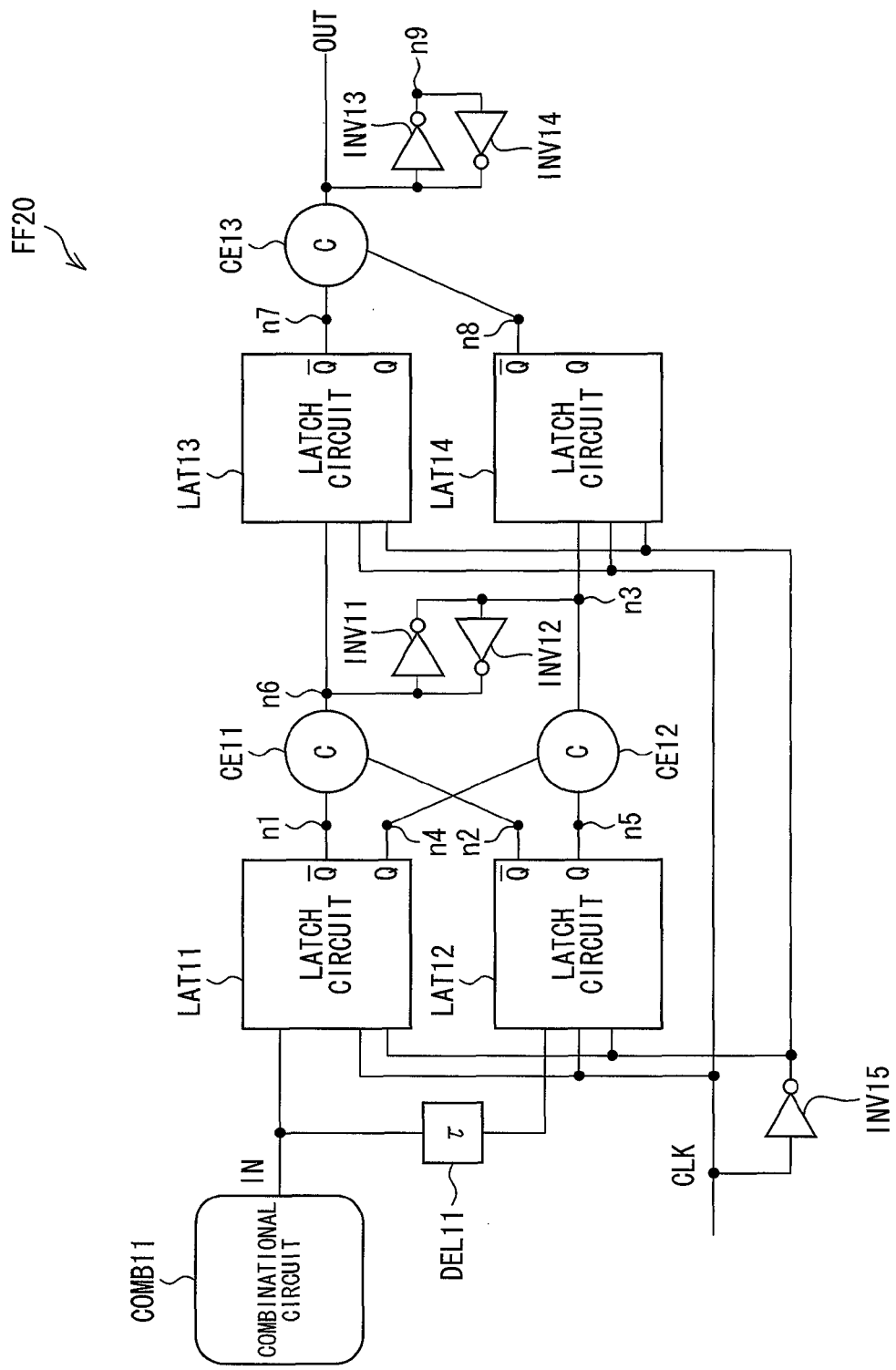

FIG. 22 is a view illustrating one example of a flip-flop circuit in accordance with Embodiment 2 of the present invention.

Figure 23:
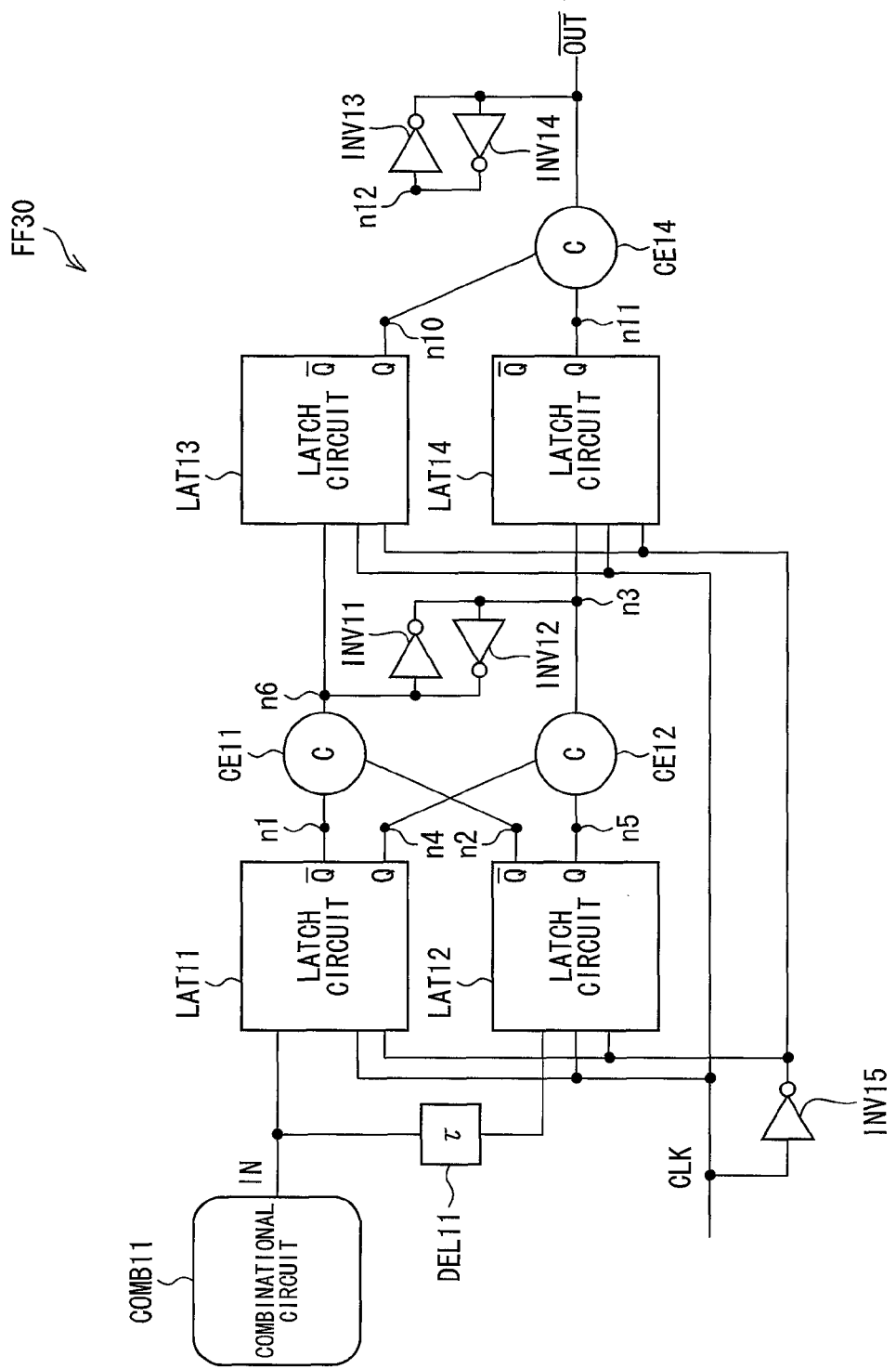

FIG. 23 is a view illustrating another example of the flip-flop circuit in accordance with Embodiment 2 of the present invention.

Figure 24:
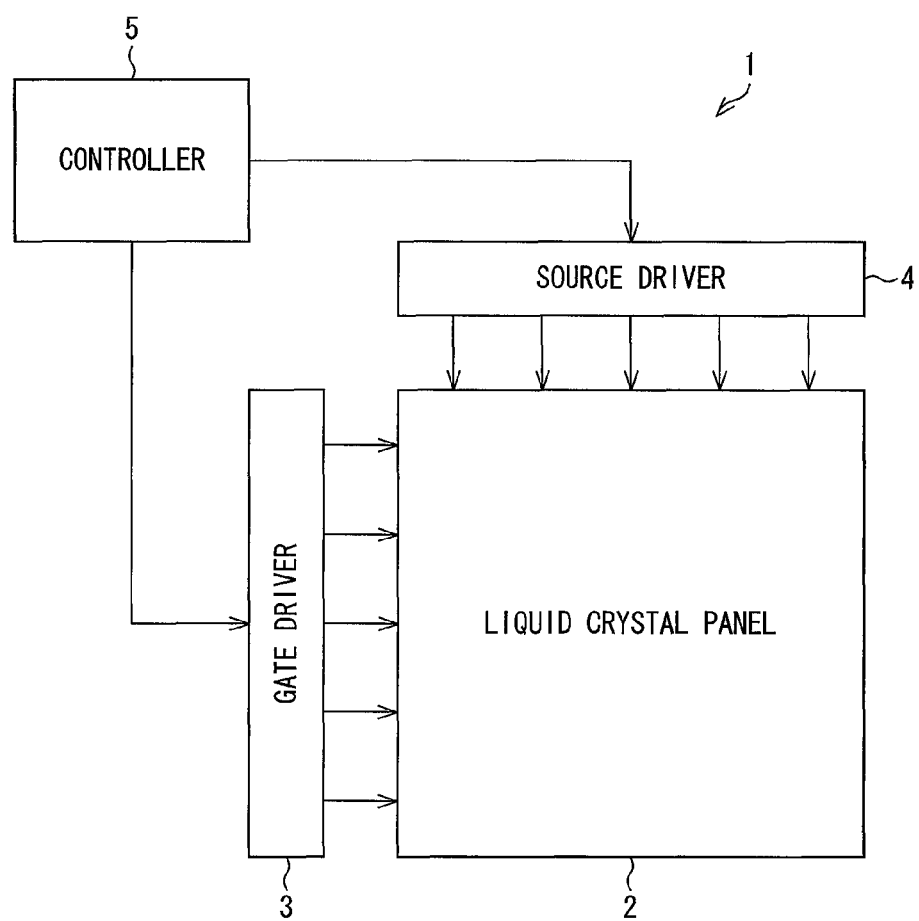

FIG. 24 is a block diagram illustrating an arrangement of a main part of a liquid crystal display device in accordance with Embodiment 2 of the present invention.

DESCRIPTION OF EMBODIMENTS

Embodiment 1

One embodiment of the present invention is described below with reference to FIGS. 1 through 21.
(Configuration of Flip-Flop Circuit of the Present Embodiment)

FIG. 1 is a view illustrating a configuration of a flip-flop circuit FF 10 of the present embodiment. The flip-flop circuit FF 10 is a flip-flop circuit that retains input data IN supplied from a combinational circuit COMB 11. The flip-flop circuit FF 10 includes (i) two master latch circuits LAT 11 and LAT 12, (ii) two slave latch circuits LAT 13 and LAT 14, (iii) four C-element circuits CE 11, CE 12, CE 13, and CE 14, (iv) five inverter circuits INV 11, INV 12, INV 13, INV 14, and INV 15, and (v) a delay circuit DEL 11.

The master latch circuits LAT 11 and LAT 12 correspond to a first master latch circuit and a second master latch circuit recited in Claims, respectively. An input terminal of the master latch circuit LAT 11 receives input data IN from the combinational circuit COMB 11. Further, an input terminal of the master latch circuit LAT 12 receives the input data IN from the combinational circuit COMB 11 via the delay circuit DEL 11. With the arrangement, the master latch circuits LAT 11 and LAT 12 latch the input data IN in accordance with a clock CLK.

The C-element circuit CE 11 corresponds to a first C-element circuit recited in Claims. One of input terminals of the C-element circuit CE 11 is connected to an inverted output terminal bar Q of the master latch circuit LAT 11, and the other one of the input terminals of the C-element circuit CE 11 is connected to an inverted output terminal bar Q of the master latch circuit LAT 12. That is, the C-element circuit CE 11 receives an inverted output of the master latch circuit LAT 11 and an inverted output of the master latch circuit LAT 12.

The C-element circuit CE 12 corresponds to a second C-element circuit recited in Claims. One of input terminals of the C-element circuit CE 12 is connected to a non-inverted output terminal Q of the master latch circuit LAT 11, and the other one of the input terminals of the C-element circuit CE 12 is connected to a non-inverted output terminal Q of the master latch circuit LAT 12. That is, the C-element circuit CE 12 receives a non-inverted output of the master latch circuit LAT 11 and a non-inverted output of the master latch circuit LAT 12.

The slave latch circuits LAT 13 and LAT 14 correspond to a first slave latch circuit and a second slave latch circuit recited in Claims, respectively. A data input terminal of the slave latch circuit LAT 13 is connected to an output terminal of the C-element circuit CE 11, and the slave latch circuit LAT 13 latches an output of the C-element circuit CE 11. A data input terminal of the slave latch circuit LAT 14 is connected to an output terminal of the C-element circuit CE 12, and the slave latch circuit LAT 14 latches an output of the C-element circuit CE 12.

The C-element circuit CE 13 corresponds to a third C-element circuit recited in Claims. One of input terminals of the C-element circuit CE 13 is connected to an inverted output terminal bar Q of the slave latch circuit LAT 13, and the other one of the input terminals of the C-element circuit CE 13 is connected to an inverted output terminal bar Q of the slave latch circuit LAT 14. That is, the C-element circuit CE 13 receives an inverted output of the slave latch circuit LAT 13 and an inverted output of the slave latch circuit LAT 14.

The C-element circuit CE 14 corresponds to a fourth C-element circuit recited in Claims. One of input terminals of the C-element circuit CE 14 is connected to a non-inverted output terminal Q of the slave latch circuit LAT 13, and the other one of the input terminals of the C-element circuit CE 14 is connected to a non-inverted output terminal Q of the slave latch circuit LAT 14. That is, the C-element circuit CE 14 receives a non-inverted output of the slave latch circuit LAT 13 and a non-inverted output of the slave latch circuit LAT 14.

The inverter circuits INV 11 and INV 12 correspond to a first inverter circuit and a second inverter circuit recited in Claims, respectively. The inverter circuits INV 11 and INV 12 are interconnected to each other. An input terminal of the inverter circuit INV 11 and an output terminal of the inverter circuit INV 12 are connected to a connection point between the output terminal of the C-element circuit CE 11 and the data input terminal of the slave latch circuit LAT 13. Moreover, an output terminal of the inverter circuit INV 11 and an input terminal of the inverter circuit INV 12 are connected to a connection point between the output terminal of the C-element circuit CE 12 and the data input terminal of the slave latch circuit LAT 14.

The inverter circuits INV 13 and INV 14 correspond to a third inverter circuit and a fourth inverter circuit recited in Claims, respectively. The inverter circuits INV 13 and INV 14 are interconnected to each other. An input terminal of the inverter circuit INV 13 and an output terminal of the inverter circuit INV 14 are connected to an output terminal of the C-element circuit CE 13. Moreover, an output terminal of the inverter circuit INV 13 and an input terminal of the inverter circuit INV 14 are connected to an output terminal of the C-element circuit CE 14.

Note that each of the configurations of the C-element circuits CE 11 to CE 14 is substantially identical with a configuration illustrated in (b) of FIG. 13.

(Comparison with Conventional Arrangement)

As described above, the flip-flop circuit FF 10 of the present embodiment has an arrangement in which a C-element circuit is duplicated, in the same manner as a conventional flip-flop circuit FF 90 illustrated in FIG. 16. Moreover, the flip-flop circuit FF 10 has an arrangement in which, in the flip-flop circuit FF 90, (i) a weak keeper circuit is not duplicated, and (ii) two inverter circuits constituting such a weak keeper circuit are cross-coupled between two C-element circuits. With the arrangement, the flip-flop circuit FF 10 can have a reduction in the number of inverter circuits, as compared with the flip-flop circuit FF 90. It is therefore possible to have a reduction in circuit size.

Figure 2:
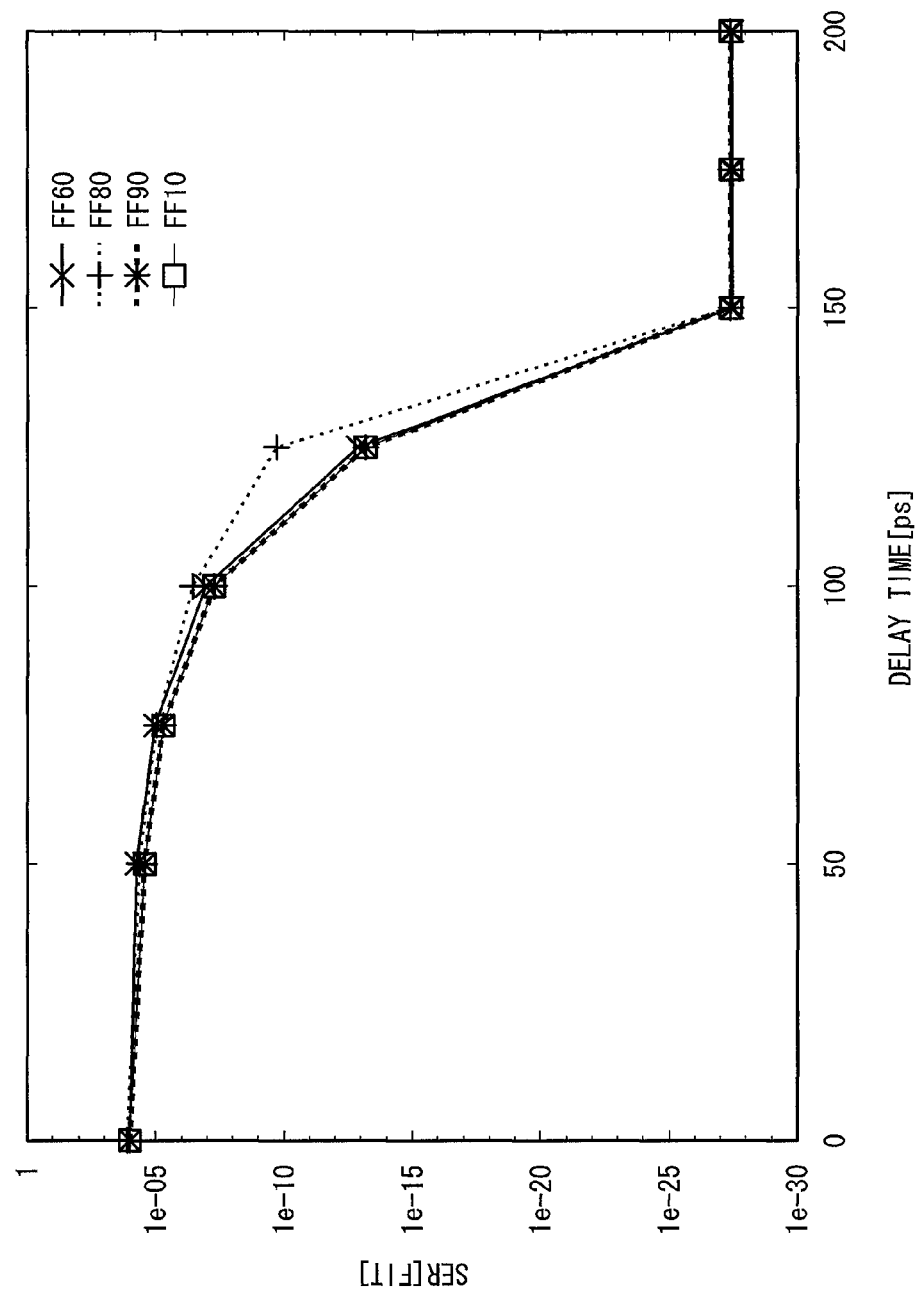
FIG. 2 is a graph showing an error ratio in terms of a delay time of a delay circuit in a conventional flip-flop circuit and an error ratio in terms of a delay time of a delay circuit in the flip-flop circuit of the present embodiment.

FIG. 2 is a graph showing (i) an error ratio with respect to a delay time of a delay circuit in each of conventional flip-flop circuits FF 60, FF 80, and FF 90 and (ii) an error ratio with respect to a delay time of a delay circuit in the flip-flop circuit FF 10 of the present embodiment. As shown in FIG. 2, an error ratio with respect to a delay time of the flip-flop circuit FF 10 of the present embodiment is substantially identical with that of each of the flip-flop circuits FF 80 and FF 90.

Figure 3:
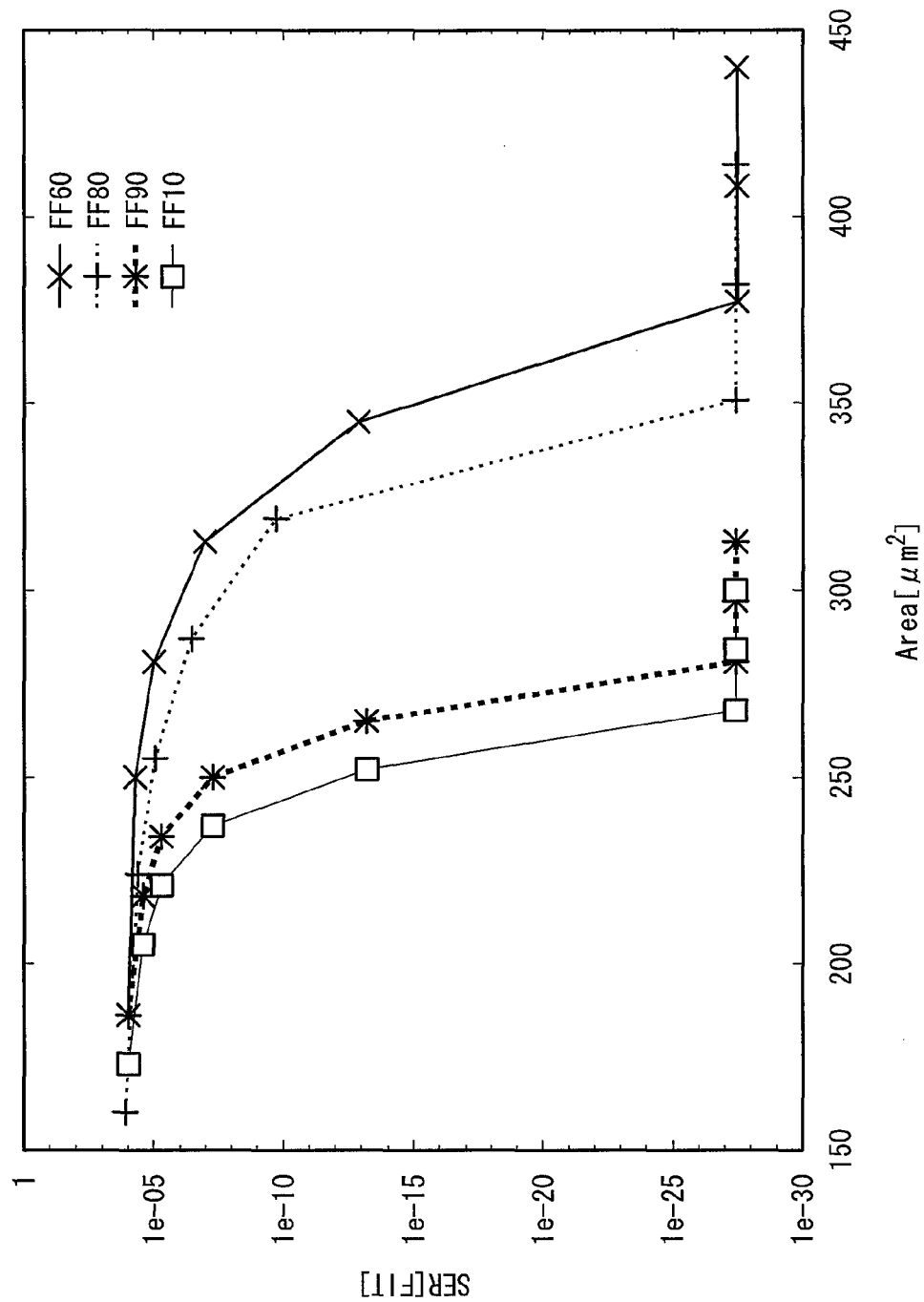
FIG. 3 is a graph showing an error ratio in terms of a circuit area of a conventional flip-flop circuit and an error ratio in terms of a circuit area of the flip-flop circuit of the present embodiment.

FIG. 3 is a graph showing (i) an error ratio with respect to a circuit area of each of the conventional flip-flop circuits FF 60, FF 80, and FF 90 and (ii) an error ratio with respect to a circuit area of the flip-flop circuit FF 10 of the present embodiment. As is clear from FIG. 3, the flip-flop circuit FF 10 of the present embodiment has a higher resistance to an error while having a small circuit area, as compared with the conventional flip-flop circuits FF 60, FF 80, and FF 90. Accordingly, the flip-flop circuit FF 10 of the present embodiment can have a reduction in circuit size without having a reduction in resistance to an error, as compared with the conventional flip-flop circuits.

Figure 4:
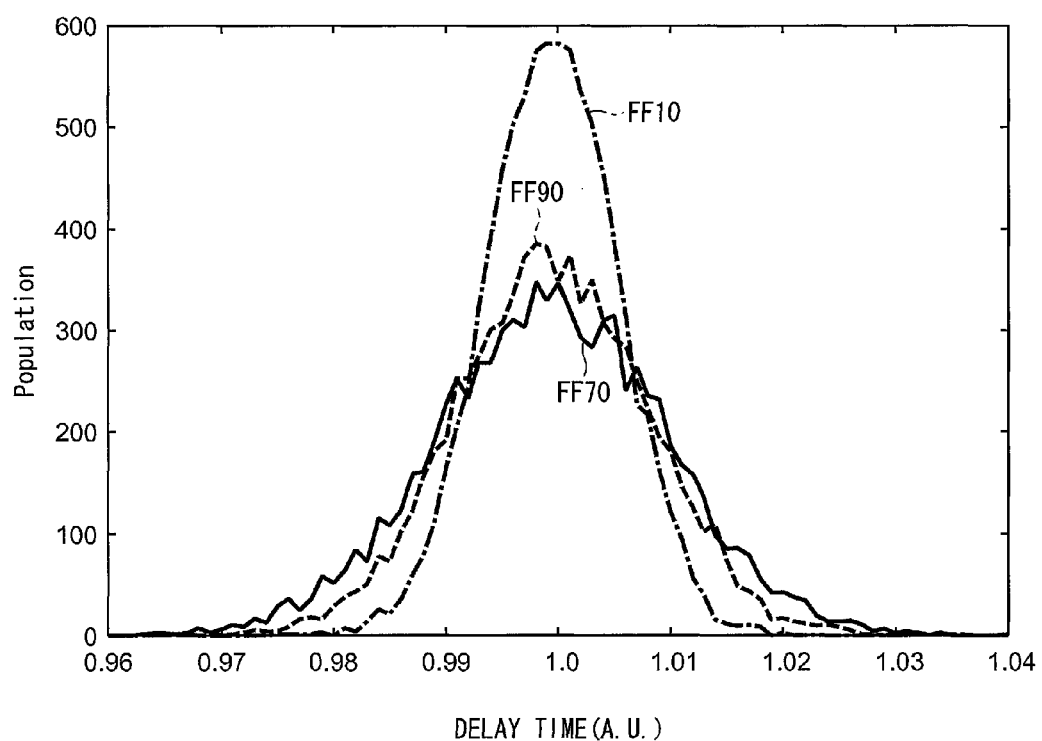
FIG. 4 is a graph showing variations of a delay time in conventional flip-flop circuits and variations of a delay time in the flip-flop circuit of the present embodiment.

The flip-flop circuit FF 10 of the present embodiment has an advantage that a change in delay time with respect to variations of transistors is small, which variations are caused in a manufacturing process. FIG. 4 is a graph showing (i) variations of a delay time in each of the conventional flip-flop circuits FF 70 and FF 90 and (ii) variations of a delay time in the flip-flop circuit FF 10 of the present embodiment. Characteristics of the flip-flop circuits FF 70 and FF 90 are identical with characteristics shown in FIG. 17. In FIG. 4, distribution of the delay time of the flip-flop circuit FF 10 is in a range of ±2%. That is, it is clear that a change in delay time in the flip-flop circuit FF 10 is smaller, as compared with that of each of the flip-flop circuits FF 70 and FF 90.

Further, the flip-flop circuit FF 10 of the present embodiment has an advantage that it is possible to have a smaller size of each of transistors constituting a C-element circuit than a size of each of transistors constituting a C-element circuit of each of the conventional flip-flop circuits FF 70, FF 80, and FF 90. The following description deals with such an advantage with reference to FIG. 5.

(a) of FIG. 5 is a view illustrating a part of a circuit configuration of the conventional flip-flop circuit FF 90 illustrated in FIG. 16. (b) of FIG. 5 is a view illustrating a part of a circuit configuration of the flip-flop circuit FF 10 of the present embodiment. With the configuration illustrated in (a) of FIG. 5, in a case where data of a weak keeper circuit constituted by the inverter circuits INV 72 and INV 73 is rewritten, an output of the inverter circuit INV 73 inhibits an output of a C-element circuit 71. Because of this, an output of the C-element circuit 71, which output is required to rewrite the data of the weak keeper circuit, becomes approximately 10 times larger than an output of each of the inverter circuits INV 72 and INV 73.

Meanwhile, with the configuration illustrated in (b) of FIG. 5, data of a data retention circuit constituted by the inverter circuits INV 11 and INV 12 is rewritten by use of outputs of two C-element circuits CE 11 and CE 12. For this reason, an output of the C-element circuit 11, which output is required to rewrite data of the data retention circuit constituted by the inverter circuits INV 11 and INV 12, is only approximately twice larger than an output of each of the inverter circuits INV 11 and INV 12. As described above, with the data retention circuit constituted by the inverter circuits INV 11 and INV 12, it is possible to rewrite the retained data more easily, as compared with the weak keeper circuit of the conventional flip-flop circuit FF 90.

It becomes therefore possible to have a reduction in a size of each of transistors constituting the C-element circuit of the flip-flop circuit FF 10 of the present embodiment, as compared with a size of each of transistors constituting the C-element circuit of the conventional flip-flop circuit FF 90. Accordingly, with the flip-flop circuit FF 10, it is possible to further reduce a circuit area, as compared with a conventional flip-flop circuit.

Moreover, the flip-flop circuit FF 10 of the present embodiment has such an advantage that, even in a case where an operating voltage is particularly low, the flip-flop circuit FF 10 does not have a reduction in its performance, as compared with a conventional flip-flop circuit. FIG. 6 is a table showing (i) a delay time and an output of the conventional flip-flop circuit FF 70, with respect to an operating voltage, and (ii) a delay time and an output of the flip-flop circuit FF 10 of the present embodiment, with respect to an operating voltage. The conventional flip-flop circuit FF 70 and the flip-flop circuit FF 10 of the present embodiment are identical with each other in circuit area. With the conventional flip-flop circuit FF 70, a delay time observed with an operating voltage of 0.5 V is greater than a delay time observed with an operating voltage of 1.2 V. Meanwhile, with the flip-flop circuit FF 10 of the present embodiment, a difference between a delay time observed with an operating voltage of 0.5 V and a delay time observed with an operating voltage of 1.2 V is small.

As described above, the flip-flop circuit FF 10 of the present embodiment can maintain high performance even in a case where an operating voltage is particularly low, and therefore, is suitably applicable to a low-voltage circuit, such as a sub-threshold circuit which is expected to be in practical use in the future.

Example 1

In order to prove that a flip-flop circuit of the present invention has a higher resistance to an error than that of a conventional flip-flop circuit, the following experiment was carried out.

As illustrated in FIG. 7, eight flip-flop circuits FF 10 of the present invention were cascade-connected to each other, so as to constitute a shift register. Two selector circuits SEL 11 and SEL 12 were connected to a flip-flop circuit FF 10 provided at a first stage. One of input terminals of the selector circuit SEL 11 received an input signal SI, and one of input terminals of the selector circuit SEL 12 received an inverted input signal bar SI. Moreover, the other one of input terminals of the SEL 11 was connected to one of data output terminals of a flip-flop circuit FF 10 provided at the last stage, and the other one of input terminals of the selector circuit SEL 12 was connected to the other one of data output terminals of the flip-flop circuit FF 10 provided at the last stage. Further, a signal RS was supplied, as a selection signal, to both the selector circuits SEL 11 and SEL 12.

In the manner described above, eight flip-flop circuits FF 10 were arranged so that a single local loop unit was formed. Further, a plurality of such local loop units were cascade-connected to each other and were irradiated with α particles generated by $^{241}$Am.

In a state where the local loop units were irradiated with the α particles, (i) the signal RS was controlled so as to cause (a) the selector circuit SEL 11 to select the input signal SI and (b) the selector circuit SEL 12 to select the inverted input signal bar SI, and (ii) a clock CLK (not illustrated) was supplied to each of the flip-flop circuits FF 10. A shift operation was thus started. Next, the signal RS was controlled so as to cause the selector circuits SEL 11 and SEL 12 to select the output of the flip-flop circuit FF 10 provided at the last stage. The shift operation was thus repeated. After a predetermined time period elapsed, the shift operation was stopped, and an output SO and a bar SO of the flip-flop circuit FF 10 provided at the last stage were detected.

Further, as a comparison example, (i) a local loop unit was constituted by cascade-connecting, to each other, eight conventional flip-flop circuits FF 70 (illustrated in (a) of FIG. 13), in the same manner as the arrangement illustrated in FIG. 7, (ii) a plurality of such local loop units were cascade-connected to each other, and (iii) the plurality of local loop units thus cascade-connected were irradiated with α a particles generated by $^{241}$Am.

In the experiment, a flip-flop circuit was operated by use of each of three clocks CLK, that is, 1 MHz, 10 MHz, and 160 MHz. The flip-flop circuit was operated at each of the frequencies for 500 minutes, and error detection was carried out by extracting retained data every ten minutes. FIG. 8 shows results of the error detection.

FIG. 8 is a graph showing a relationship between a clock frequency and the number of inverted flip-flops in a case where the plurality of local loop units were formed and irradiated with an α-ray for 100 minutes. In FIG. 8, a black bar shows the number of errors of the flip-flop circuit FF 10 of the present invention, and a white bar shows the number of errors of the conventional flip-flop circuit FF 70. The higher the clock frequency became, the greater the number of errors of the flip-flop circuit FF 70 became. Meanwhile, almost no error was observed with the flip-flop circuit FF 10, irrespective of the clock frequency. Particularly, in a case where the clock frequency was 160 MHz, the number of errors of the flip-flop circuit FF 10 was approximately 1/150 of the number of errors of the flip-flop circuit FF 70. This shows that, the higher the clock frequency is, the more greatly the flip-flop FF 10 is improved in resistance to an error, as compared with the conventional flip-flop circuit.

With the experiment described above, it was clear that the flip-flop circuit of the present invention has a particularly greater resistance to an error than that of a conventional flip-flop circuit.

FIG. 18 is a graph showing (i) a relationship between a circuit area and a delay time of the flip-flop circuit FF 10 of the present invention and (ii) a relationship between a circuit area and a delay time of each of conventional flip-flop circuits FF 60, FF 70, FF 80, and FF 90. As is clear from FIG. 18, the flip-flop circuit FF 10 of the present invention had the smallest area-delay product (ADP) among these flip-flop circuits.

Example 2

Further, the inventors of the present invention carried out an experiment in which a shift register was irradiated with a neutron ray. Eight flip-flop circuits FF 10 of the present invention were cascade-connected to each other, so as to constitute a shift register (see FIG. 7). Eight conventional flip-flop circuits FF 90 were cascade-connected to each other, so as to constitute another shift register. Each of the shift registers was irradiated with a neutron ray, and, for each of the shift registers, the number of errors generated in a predetermined time period was counted. As a result, in a case where an operating frequency of the circuits was 100 MHz, the number of errors in the shift register constituted by the flip-flop circuits FF 10 was approximately 31% of the number of errors in the shift register constituted by the flip-flop circuits FF 90. Further, in a case where an operating frequency of the circuits was 10 MHz, the number of errors in the shift register constituted by the flip-flop circuits FF 10 was approximately 47% of the number of errors in the shift register constituted by the flip-flop circuits FF 90. Furthermore, in a case where an operating frequency of the circuits was 1 MHz, the number of errors in the shift register constituted by the flip-flop circuits FF 10 was approximately 6% of the number of errors in the shift register constituted by the flip-flop circuits FF 90.

As described above, it became clear that the flip-flop circuit FF 10 of the present invention has a higher resistance to an error due to a neutron ray than that of the conventional flip-flop circuit.

Example 3

Next, an oscillator (ring oscillator) was constituted by a flip-flop circuit, and variations of an oscillating frequency were measured. FIG. 19 shows results of the measurement.

(a) of FIG. 19 is a graph showing variations of an oscillating frequency of an oscillator constituted by a flip-flop circuit FF 10 of the present invention. (b) of FIG. 19 is a graph showing variations of an oscillating frequency of an oscillator constituted by a conventional flip-flop circuit FF 90. As is clear from these graphs, the flip-flop circuit of the present invention has less variations of the oscillating frequency than those of the oscillating frequency of the conventional flip-flop circuit. That is, the flip-flop circuit of the present invention has less variations of a delay time than those of the conventional flip-flop circuit.

(Layout Structure for Further Increasing Resistance to Error)

Next, the following description deals with a layout structure for further increasing a resistance to an error. There is such a combination of nodes (hereinafter, referred to as "sensitive nodes") in the flip-flop circuit FF 10 that, in a case where electric potentials are simultaneously inverted, an output is inverted. FIG. 20 illustrates a specific example of such sensitive nodes.

The inventors of the present invention have found that there are four combinations, each being regarded as "sensitive nodes", in the flip-flop circuit FF 10 illustrated in FIG. 20, that is, a combination of nodes n1, n2, and n3, a combination of nodes n4, n5, and n6, a combination of nodes n7, n8, and n9, and a combination of nodes n10, n11, and n12. These nodes are defined as described below.

The node n1 is a node which connects an inverted output terminal bar Q of a latch circuit LAT 11 and one of input terminals of a C-element circuit CE11 to each other. The node n2 is a node which connects an inverted output terminal bar Q of a latch circuit LAT 12 and the other one of input terminals of the C-element circuit CE 11 to each other. The node 3 is a node which connects an output terminal of a C-element circuit CE 12, an output terminal of an inverter circuit INV 11, an input terminal of an inverter circuit INV 12, and a data input terminal of a latch circuit LAT 14 to each other.

Node n4 is a node which connects a non-inverted output terminal Q of the latch circuit LAT 11 and one of input terminals of the C-element circuit CE 12 to each other. The node n5 is a node which connects a non-inverted output terminal Q of the latch circuit LAT 12 and the other one of input terminals of the C-element circuit CE 12 to each other. The node n6 is a node which connects an output terminal of the C-element circuit CE 11, an input terminal of the inverter circuit INV 11, an output terminal of the inverter circuit INV 12, and a data input terminal of a latch circuit LAT 13 to each other.

The node n7 is a node which connects a non-inverted output terminal bar Q of the latch circuit LAT 13 and one of input terminals of a C-element circuit CE 13 to each other. The node n8 is a node which connects an inverted output terminal bar Q of the latch circuit LAT 14 and the other one of input terminals of the C-element circuit CE 13 to each other. The node n9 is a node which connects an output terminal of a C-element circuit CE 14, an output terminal of an inverter circuit INV 13, and an input terminal of an inverter circuit INV 14 to each other.

The node n10 is a node which connects a non-inverted output terminal Q of the latch circuit LAT 13 and one of input terminals of the C-element circuit CE 14 to each other. The node n11 is a node which connects a non-inverted output terminal Q of the latch circuit LAT 14 and the other one of input terminals of the C-element circuit CE 14 to each other. The node n12 is a node which connects an output terminal of the C-element circuit CE 13, an input terminal of the inverter circuit INV 13, and an output terminal of the inverter circuit INV 14 to each other.

The nodes n1 through n12 correspond to a first node through a twelfth node recited in Claims, respectively. In a case where these nodes are defined as described above, each of the following combinations is regarded as "sensitive nodes": the combination of the nodes n1, n2, and n3; the combination of nodes n4, n5, and n6; the combination of the nodes n7, n8, and n9; and the combination of the nodes n10, n11, and n12. For this reason, in order to avoid a case where the electric potentials are simultaneously inverted due to radiation, it is desirable that the following distances are set to be as long as possible: a distance between any two of the nodes n1, n2, and n3; a distance between any two of the nodes n4, n5, and n6; a distance between any two of the nodes n7, n8, and n9; and a distance between any two of the nodes n10, n11, and n12.

Here, the following description deals with a relationship between a distance between sensitive nodes and an incidence rate of a soft error, with reference to FIG. 21.

In (a) of FIG. 21, a horizontal axis indicates a distance between sensitive nodes, and a vertical axis indicates an incidence rate of MCU with respect to SEU. (b) of FIG. 21 is such a graph that a part of the horizontal axis of the graph shown in (a) of FIG. 21 is enlarged. (b) of FIG. 21 shows an incidence rate of MCU with respect to SEU in a case where a distance between sensitive nodes is in a range of 1.5 µm to 3.5 µm.

Further, a full line indicates an incidence rate of MCU due to charge sharing (CS), with respect to SEU, and a dotted line indicates an incidence rate of MCU due to successive hits (SH), with respect to SEU. A dashed-dotted line indicates a total incidence rate of MCU (including MCU due to CS and MCU due to SH) with respect to SEU.

The incidence rate of MCU with respect to SEU (hereinafter, referred to as "error ratio") indicates how much resistance to a soft error a redundant flip-flop circuit has, as compared with a general flip-flop circuit. As shown in (a) of FIG. 21, in a case where a distance between sensitive nodes is set to be not less than 0.86 µm, it is possible to suppress the error ratio to be not more than 1/10 (10%). Further, as shown in (b)

of FIG. 21, in a case where a distance between sensitive nodes is set to be not less than 1.75 μm, it is possible to suppress the error ratio to be not more than 1/100 (1%). Furthermore, in a case where a distance between sensitive nodes is set to be not less than 3.50 μm, it is possible to suppress the error ratio to be not more than 1/1000 (0.1%).

For the reasons described above, it is preferable that a distance between sensitive nodes in the flip-flop circuit FF 10 illustrated in FIG. 20 is set to be not less than 0.86 μm, more preferably, not less than 1.75 μm, further more preferably, not less than 3.50 μm. By setting such a distance, it becomes possible to further increase a resistance to a soft error.

Embodiment 2

Embodiment 2 of the present invention is described below with reference to FIGS. 22 through 24. In the present embodiment, a modified example of a flip-flop circuit FF 10 of Embodiment 1 of the present invention, a semiconductor device including a flip-flop circuit of the present invention, and an electronic device including a flip-flop circuit of the present invention are explained.

(Configuration of Flip-Flop Circuit of the Present Embodiment)

FIG. 22 is a view illustrating a configuration of flip-flop circuit FF 20 of the present embodiment. The flip-flop circuit FF 20 has such an arrangement that the flip-flop circuit FF 10 of Embodiment 1 includes no C-element circuit CE 14.

That is, a part of an arrangement of the flip-flop circuit FF 20, which part is connected to an output side of slave latch circuits LAT 13 and LAT 14, is identical with that of each of conventional flip-flop circuits illustrated in FIGS. 13 through 16. Such flip-flop circuits FF 20 are cascade-connected to each other, so as to constitute a shift register. With the shift register, even if an SET pulse is generated in the C-element circuit CE 13, the SET pulse is not latched by two master latch circuits LAT 11 and LAT 12 simultaneously. This is because a flip-flop circuit FF 20 provided downstream of the flip-flop circuit FF 20 in which the SET pulse is generated includes a delay circuit DEL 11. Accordingly, the flip-flop circuit FF 20 has a resistance to an error, which is substantially identical with that of the flip-flop circuit FF 10 of Embodiment 1.

In a case where connections between (i) the master latch circuits LAT 11 and LAT 12 and (ii) the slave latch circuits LAT 13 and LAT 14 are arranged as being identical with connections of a conventional arrangement, the SET pulse generated in a C-element circuit is taken by both the slave latch circuits LAT 13 and LAT 14. This is because the C-element circuits connected to an output side of the master latch circuits LAT 11 and LAT 12 are directly connected to the slave latch circuits.

The flip-flop circuit FF 20 has an arrangement in which an inverted output terminal bar Q of the slave latch circuit LAT 13 and an inverted output terminal bar Q of the slave latch circuit LAT 14 are connected to the C-element circuit CE 13. Not, however, that it is possible that a non-inverted output terminal bar Q of the slave latch circuit LAT 13 and a non-inverted output terminal bar Q of the slave latch circuit LAT 14 are connected to the C-element circuit CE 13. FIG. 23 illustrates such an arrangement.

FIG. 23 is a view illustrating an arrangement of a flip-flop circuit FF 30 of the present embodiment. The flip-flop circuit FF 30 has such an arrangement that the flip-flop circuit FF 10 of Embodiment 1 includes no C-element circuit CE 13. The flip-flop circuit FF 30 also has a resistance to an error, which is substantially identical with that of the flip-flop circuit FF 10 of Embodiment 1.

Further, each of the flip-flop circuits FF 20 and FF 30 is less than the flip-flop circuit FF 10 in the number of elements constituting a circuit. For this reason, the flip-flop circuits FF 20 and FF 30 are suitably applicable to an electronic device for which a reduction in size is demanded.

Further, in order to further increase a resistance to an error, it is also preferable that, in each of the flip-flop circuits FF 20 and FF 30, a distance between sensitive nodes is set to be as long as possible. Specifically, in the flip-flop circuit FF 20 illustrated in FIG. 22, it is desirable that the following distances are set to be as long as possible: a distance between any two of nodes n 1, n2, and n3; a distance between any two of nodes n4, n5, and n6; and a distance between any two of nodes n7, n8, and n9. Further, it is desirable that, in the flip-flop circuit FF 30 illustrated in FIG. 23, the following distances are set to be as long as possible: a distance between any two of nodes n 1, n2, and n3; a distance between any two of nodes n4, n5, and n6; and a distance between any two of nodes n10, n11, and n12.

It is preferable that, in each of the flip-flop circuits FF 20 and FF 30, a distance between sensitive nodes is not less than 0.86 μm, more preferably, not less than 1.75 μm, further more preferably, not less than 3.50 μm. By setting such a distance, it becomes possible to further increase a resistance to a soft error.

(Example of Electronic Device Employing Flip-Flop Circuit)

The present invention is applicable to various electronic devices. The following description deals with, as an example of such an electronic device, a liquid crystal display device.

FIG. 24 is a block diagram illustrating an arrangement of a main part of a liquid crystal display device 1 of the present embodiment. The liquid crystal display device 1 includes a liquid crystal panel 2, a gate driver 3, a source driver 4, and a controller 5. The gate driver 3 outputs, on the basis of, for example, an operating clock inputted via the controller 5, a scan signal for successively scanning gate lines provided in the liquid crystal panel 2. The source driver 4 (i) carries out time-division with respect to display data inputted via the controller 5, (ii) causes the display data thus time-divided to be subjected to D/A conversion, and (iii) outputs, to the liquid crystal panel 2, a data signal for displaying a gray scale in accordance with a brightness of a target pixel to be displayed.

Here, the gate driver 3 corresponds to a semiconductor device recited in Claims. The gate driver 3 is constituted by a shift register in which a plurality of flip-flop circuits are cascade-connected to each other. An output terminal of each of the plurality of flip-flop circuits is connected to (i) a flip-flop circuit provided downstream of the each of the plurality of flip-flop circuits, and (ii) a corresponding gate line provided in the liquid crystal panel 2.

Further, the liquid crystal display device 1 employs the flip-flop circuit FF 10 described above, as a flip-flop circuit constituting the gate driver 3. With the arrangement, the liquid crystal display device 1 can display a high-quality image in which a defect due to a soft error is highly unlikely to occur.

[Additional Matters]

The present invention is not limited to the description of the embodiments above, but may be altered by a skilled person within the scope of the claims. An embodiment based on a proper combination of technical means disclosed in different embodiments is encompassed in the technical scope of the present invention.

A flip-flop circuit of the present invention, for retaining input data, includes: a first master latch circuit for latching the input data; a second master latch circuit for latching the input data; a first C-element circuit for receiving an inverted output of the first master latch circuit and an inverted output of the second master latch circuit; a second C-element circuit for receiving a non-inverted output of the first master latch circuit and a non-inverted output of the second master latch circuit; a first slave latch circuit for latching an output of the first C-element circuit; a second slave latch circuit for latching an output of the second C-element circuit; a third C-element circuit for receiving an inverted output of the first slave latch circuit and an inverted output of the second slave latch circuit; a first inverter circuit; a second inverter circuit being interconnected to the first inverter circuit; a third inverter circuit; and a fourth inverter circuit being interconnected to the third inverter circuit, an input terminal of the first inverter circuit and an output terminal of the second inverter circuit being connected to a connection point between an output terminal of the first C-element circuit and a data input terminal of the first slave latch circuit, an output terminal of the first inverter circuit and an input terminal of the second inverter circuit being connected to a connection point between an output terminal of the second C-element circuit and a data input terminal of the second slave latch circuit, an input terminal of the third inverter circuit and an output terminal of the fourth inverter circuit being connected to an output terminal of the third C-element circuit.

A flip-flop circuit of the present invention, for retaining input data, includes: a first master latch circuit for latching the input data; a second master latch circuit for latching the input data; a first C-element circuit for receiving an inverted output of the first master latch circuit and an inverted output of the second master latch circuit; a second C-element circuit for receiving a non-inverted output of the first master latch circuit and a non-inverted output of the second master latch circuit; a first slave latch circuit for latching an output of the first C-element circuit; a second slave latch circuit for latching an output of the second C-element circuit; a fourth C-element circuit for receiving a non-inverted output of the first slave latch circuit and a non-inverted output of the second slave latch circuit; a first inverter circuit; a second inverter circuit being interconnected to the first inverter circuit; a third inverter circuit; and a fourth inverter circuit being interconnected to the third inverter circuit, an input terminal of the first inverter circuit and an output terminal of the second inverter circuit being connected to a connection point between an output terminal of the first C-element circuit and a data input terminal of the first slave latch circuit, an output terminal of the first inverter circuit and an input terminal of the second inverter circuit being connected to a connection point between an output terminal of the second C-element circuit and a data input terminal of the second slave latch circuit, an output terminal of the third inverter circuit and an input terminal of the fourth inverter circuit being connected to an output terminal of the fourth C-element circuit.

According to the arrangement, the first C-element circuit retains immediately previous data, in a case where a value of the inverted output of the first master latch circuit and a value of the inverted output of the second master latch circuit are different from each other. Further, the second C-element circuit retains immediately previous data, in a case where a value of the non-inverted output of the first master latch circuit and a value of the non-inverted output of the second master latch circuit are different from each other. Accordingly, even if one of the output of the first master latch circuit and the output of the second master latch circuit is inverted due to a soft error, the output of the first C-element circuit and the output of the second C-element circuit are not inverted. That is, the first inverter circuit and the second inverter circuit have both (i) function of a weak keeper circuit for the output of the first C-element circuit, and (ii) a function of a weak keeper circuit for the output of the second C-element circuit. Accordingly, it is possible to have a reduction in circuit area, as compered with a conventional arrangement in which weak keeper circuits are provided for the first C-element circuit and the second C-element circuit, respectively.

Further, even if one of the output of the first C-element circuit and the output of the second C-element circuit is inverted due to a soft error, it is possible to prevent the output thus inverted from being latched by the first slave latch circuit or the second slave latch circuit.

Furthermore, with a data retention circuit constituted by inverter circuits which are interconnected to each other, it is easy to rewrite retention data, as compared with conventional weak keeper circuits which are connected to duplicated C-element circuits, respectively. For this reason, it becomes possible to have a reduction in a size of each of transistors constituting the first C-element circuit and the second C-element circuit, as compared with a size of each of transistors constituting a C-element circuit of a conventional flip-flop circuit. Accordingly, with the flip-flop circuit of the present invention, it is possible to have a further reduction in circuit area, as compared with the conventional flip-flop circuit.

With the data retention circuit constituted by the inverter circuits which are interconnected to each other, it is easy to rewrite retention data, as compared with conventional weak keeper circuits which are connected to duplicated C-element circuits, respectively. For this reason, there is a small influence on a delay time, even if a gate length or a threshold value of each of the transistors constituting the weak keeper circuits is changed due to variations of such transistors.

Moreover, since it is easy to rewrite retention data, it is unnecessary to have a reduction in a size of each of transistors constituting the weak keeper circuits. Accordingly, variations of a gate length or a threshold value of each of transistors constituting the weak keeper circuits become less, and therefore variations of delay times become less. Accordingly, it becomes possible to realize a flip-flop circuit which (i) can have a significant reduction in circuit area and (ii) have a reduction in variations of a delay time.

The flip-flop circuit of the present invention preferably further includes a delay circuit, the input data being supplied to the second master latch circuit via the delay circuit.

According to the arrangement, provision of the delay circuit can prevent both the first master latch circuit and the second master latch circuit from latching an error pulse, even if a soft error is generated due to a collision of a high-energy neutron against, for example, a combinational circuit which outputs input data to the flip-flop circuit. Accordingly, it is possible to further increase the flip-flop circuit in resistance to an error.

The flip-flop circuit of the present invention is preferably arranged such that: a first node is a node which connects an inverted output terminal of the first master latch circuit and one of input terminals of the first C-element circuit to each other; a second node is a node which connects an inverted output terminal of the second master latch circuit and the other one of input terminals of the first C-element circuit to each other; a third node is a node which connects the output terminal of the second C-element circuit, the output terminal of the first inverter circuit, the input terminal of the second inverter circuit, and the data input terminal of the second slave latch circuit to each other; a fourth node is a node which connects a non-inverted output terminal of the first master latch circuit and one of input terminals of the second C-element circuit to each other; a fifth node is a node which connects a non-inverted output terminal of the second master latch circuit and the other one of input terminals of the second C-element circuit to each other; a sixth node is a node which connects the output terminal of the first C-element circuit, the input terminal of the first inverter circuit, the output terminal of the second inverter circuit, and the data input terminal of the first slave latch circuit to each other; a seventh node is a node which connects an inverted output terminal of the first slave latch circuit and one of input terminals of the third C-element circuit to each other; an eighth node is a node which connects an inverted output terminal of the second slave latch circuit and the other one of input terminals of the third C-element circuit to each other; a ninth node is a node which connects the output terminal of the fourth C-element circuit, the output terminal of the third inverter circuit, and the input terminal of the fourth inverter circuit to each other; a tenth node is a node which connects a non-inverted output terminal of the first slave latch circuit and one of input terminals of the fourth C-element circuit to each other; an eleventh node is a node which connects a non-inverted output terminal of the second slave latch circuit and the other one of input terminals of the fourth C-element circuit to each other; a twelfth node is a node which connects the output terminal of the third C-element circuit, the input terminal of the third inverter circuit, and the output terminal of the fourth inverter circuit to each other; a distance between any two of the first node, the second node, and the third node is not less than 0.86 µm; a distance between any two of the fourth node, the fifth node, and the sixth node is not less than 0.86 µm; a distance between any two of the seventh node, the eighth node, and the ninth node is not less than 0.86 µm; and a distance between any two of the tenth node, the eleventh node, and the twelfth node is not less than 0.86 µm.

The flip-flop circuit of the present invention is preferably arranged such that: a first node is a node which connects an inverted output terminal of the first master latch circuit and one of input terminals of the first C-element circuit to each other; a second node is a node which connects an inverted output terminal of the second master latch circuit and the other one of input terminals of the first C-element circuit to each other; a third node is a node which connects the output terminal of the second C-element circuit, the output terminal of the first inverter circuit, the input terminal of the second inverter circuit, and the data input terminal of the second slave latch circuit to each other; a fourth node is a node which connects a non-inverted output terminal of the first master latch circuit and one of input terminals of the second C-element circuit to each other; a fifth node is a node which connects a non-inverted output terminal of the second master latch circuit and the other one of input terminals of the second C-element circuit to each other; a sixth node is a node which connects the output terminal of the first C-element circuit, the input terminal of the first inverter circuit, the output terminal of the second inverter circuit, and the data input terminal of the first slave latch circuit to each other; a seventh node is a node which connects an inverted output terminal of the first slave latch circuit and one of input terminals of the third C-element circuit to each other; an eighth node is a node which connects an inverted output terminal of the second slave latch circuit and the other one of input terminals of the third C-element circuit to each other; a ninth node is a node which connects the output terminal of the third inverter circuit and the input terminal of the fourth inverter circuit; a distance between any two of the first node, the second node, and the third node is not less than 0.86 µm; a distance between any two of the fourth node, the fifth node, and the sixth node is not less than 0.86 µm; and a distance between any two of the seventh node, the eighth node, and the ninth node is not less than 0.86 µm.

The flip-flop circuit of the present invention is preferably arranges such that: a first node is a node which connects an inverted output terminal of the first master latch circuit and one of input terminals of the first C-element circuit to each other; a second node is a node which connects an inverted output terminal of the second master latch circuit and the other one of input terminals of the first C-element circuit to each other; a third node is a node which connects the output terminal of the second C-element circuit, the output terminal of the first inverter circuit, the input terminal of the second inverter circuit, and the data input terminal of the second slave latch circuit to each other; a fourth node is a node which connects a non-inverted output terminal of the first master latch circuit and one of input terminals of the second C-element circuit to each other; a fifth node is a node which connects a non-inverted output terminal of the second master latch circuit and the other one of input terminals of the second C-element circuit to each other; a sixth node is a node which connects the output terminal of the first C-element circuit, the input terminal of the first inverter circuit, the output terminal of the second inverter circuit, and the data input terminal of the first slave latch circuit to each other; a tenth node is a node which connects a non-inverted output terminal of the first slave latch circuit and one of input terminals of the fourth C-element circuit to each other; an eleventh node is a node which connects a non-inverted output terminal of the second slave latch circuit and the other one of input terminals of the fourth C-element circuit to each other; a twelfth node is a node which connects the input terminal of the third inverter circuit and the output terminal of the fourth inverter circuit to each other; a distance between any two of the first node, the second node, and the third node is not less than 0.86 µm; a distance between any two of the fourth node, the fifth node, and the sixth node is not less than 0.86 µm; and a distance between any two of the tenth node, the eleventh node, and the twelfth node is not less than 0.86 µm.

According to the arrangement, since a distance between sensitive nodes is large, it is possible to further increase a resistance to a soft error.

A semiconductor device of the present invention includes any one of the flip-flop circuits described above. Further, an electronic device of the present invention includes the semiconductor device described above.

INDUSTRIAL APPLICABILITY

The present invention is suitably applicable to, particularly, an integrated circuit which operates with a low voltage. Further, a flip-flop circuit of the present invention and a semiconductor device employing the flip-flop circuit of the present invention are applicable to various electronic devices. Particularly, the present invention is suitably applicable to a high-quality and large-scale electronic device, such as a super computer and a server computer, each of which employs such a circuit that, at present, since it is necessary to reduce an error ratio, the circuit is caused to have a large redundancy. Further, it is expected that a household electronic device (such as a personal computer, a display device, and a camera) and a mobile electronic device (such as a mobile phone, a smart phone, a PDA, a laptop personal computer, and a tablet personal computer) will be developed for sure to have higher performance in the future. Accordingly, the present invention is considered to be required not only for a special-purpose electronic device but also for a general-purpose electronic device.

REFERENCE SIGNS LIST

1: Liquid crystal display device (electronic device)
3: Gate driver (semiconductor device)
FF 10: Flip-flop circuit
FF 20: Flip-flop circuit
FF 30: Flip-flop circuit
CE 11: C-element circuit (first C-element circuit)
CE 12: C-element circuit (second C-element circuit)
CE 13: C-element circuit (third C-element circuit)
CE 14: C-element circuit (fourth C-element circuit)
COMB 11: Combinational circuit
DEL 11: Delay circuit
IN: Input data
INV 11: Inverter circuit (first inverter circuit)
INV 12: Inverter circuit (second inverter circuit)
INV 13: Inverter circuit (third inverter circuit)
INV 14: Inverter circuit (fourth inverter circuit)
LAT 11: Master latch circuit (first master latch circuit)
LAT 12: Master latch circuit (second master latch circuit)
LAT 13: Slave latch circuit (first slave latch circuit)
LAT 14: Slave latch circuit (second slave latch circuit)
n1: Node (first node)
n2: Node (second node)
n3: Node (third node)
n4: Node (fourth node)
n5: Node (fifth node)
n6: Node (sixth node)
n7: Node (seventh node)
n8: Node (eighth node)
n9: Node (ninth node)
n10: Node (tenth node)
n11: Node (eleventh node)
n12: Node (twelfth node)

The invention claimed is:

1. A flip-flop circuit for retaining input data, comprising:
a first master latch circuit for latching the input data;
a second master latch circuit for latching the input data;
a first C-element circuit for receiving an inverted output of the first master latch circuit and an inverted output of the second master latch circuit;
a second C-element circuit for receiving a non-inverted output of the first master latch circuit and a non-inverted output of the second master latch circuit;
a first slave latch circuit for latching an output of the first C-element circuit;
a second slave latch circuit for latching an output of the second C-element circuit;
a third C-element circuit for receiving an inverted output of the first slave latch circuit and an inverted output of the second slave latch circuit;
a fourth C-element circuit for receiving a non-inverted output of the first slave latch circuit and a non-inverted output of the second slave latch circuit;
a first inverter circuit;
a second inverter circuit being interconnected to the first inverter circuit;
a third inverter circuit; and
a fourth inverter circuit being interconnected to the third inverter circuit,
an input terminal of the first inverter circuit and an output terminal of the second inverter circuit being connected to a connection point between an output terminal of the first C-element circuit and a data input terminal of the first slave latch circuit,
an output terminal of the first inverter circuit and an input terminal of the second inverter circuit being connected to a connection point between an output terminal of the second C-element circuit and a data input terminal of the second slave latch circuit,
an input terminal of the third inverter circuit and an output terminal of the fourth inverter circuit being connected to an output terminal of the third C-element circuit,
an output terminal of the third inverter circuit and an input terminal of the fourth inverter circuit being connected to an output terminal of the fourth C-element circuit.

2. The flip-flop circuit as set forth in claim 1, further comprising:
a delay circuit,
the input data being supplied to the second master latch circuit via the delay circuit.

3. A semiconductor device comprising:
a flip-flop circuit recited in claim 2.

4. The flip-flop circuit as set forth in claim 1, wherein:
a first node is a node which connects an inverted output terminal of the first master latch circuit and one of input terminals of the first C-element circuit to each other;
a second node is a node which connects an inverted output terminal of the second master latch circuit and the other one of input terminals of the first C-element circuit to each other;
a third node is a node which connects the output terminal of the second C-element circuit, the output terminal of the first inverter circuit, the input terminal of the second inverter circuit, and the data input terminal of the second slave latch circuit to each other;
a fourth node is a node which connects a non-inverted output terminal of the first master latch circuit and one of input terminals of the second C-element circuit to each other;
a fifth node is a node which connects a non-inverted output terminal of the second master latch circuit and the other one of input terminals of the second C-element circuit to each other;
a sixth node is a node which connects the output terminal of the first C-element circuit, the input terminal of the first inverter circuit, the output terminal of the second inverter circuit, and the data input terminal of the first slave latch circuit to each other;
a seventh node is a node which connects an inverted output terminal of the first slave latch circuit and one of input terminals of the third C-element circuit to each other;
an eighth node is a node which connects an inverted output terminal of the second slave latch circuit and the other one of input terminals of the third C-element circuit to each other;
a ninth node is a node which connects the output terminal of the fourth C-element circuit, the output terminal of the third inverter circuit, and the input terminal of the fourth inverter circuit to each other;
a tenth node is a node which connects a non-inverted output terminal of the first slave latch circuit and one of input terminals of the fourth C-element circuit to each other;
an eleventh node is a node which connects a non-inverted output terminal of the second slave latch circuit and the other one of input terminals of the fourth C-element circuit to each other;
a twelfth node is a node which connects the output terminal of the third C-element circuit, the input terminal of the third inverter circuit, and the output terminal of the fourth inverter circuit to each other;
a distance between any two of the first node, the second node, and the third node is not less than 0.86 µm;

a distance between any two of the fourth node, the fifth node, and the sixth node is not less than 0.86 µm;
a distance between any two of the seventh node, the eighth node, and the ninth node is not less than 0.86 µm; and
a distance between any two of the tenth node, the eleventh node, and the twelfth node is not less than 0.86 µm.

5. A semiconductor device comprising:
a flip-flop circuit recited in claim 4.

6. A semiconductor device comprising:
a flip-flop circuit recited in claim 1.

7. An electronic device comprising:
a semiconductor device recited in claim 6.

8. A flip-flop circuit for retaining input data, comprising:
a first master latch circuit for latching the input data;
a second master latch circuit for latching the input data;
a first C-element circuit for receiving an inverted output of the first master latch circuit and an inverted output of the second master latch circuit;
a second C-element circuit for receiving a non-inverted output of the first master latch circuit and a non-inverted output of the second master latch circuit;
a first slave latch circuit for latching an output of the first C-element circuit;
a second slave latch circuit for latching an output of the second C-element circuit;
a third C-element circuit for receiving an inverted output of the first slave latch circuit and an inverted output of the second slave latch circuit;
a first inverter circuit;
a second inverter circuit being interconnected to the first inverter circuit;
a third inverter circuit; and
a fourth inverter circuit being interconnected to the third inverter circuit,
an input terminal of the first inverter circuit and an output terminal of the second inverter circuit being connected to a connection point between an output terminal of the first C-element circuit and a data input terminal of the first slave latch circuit,
an output terminal of the first inverter circuit and an input terminal of the second inverter circuit being connected to a connection point between an output terminal of the second C-element circuit and a data input terminal of the second slave latch circuit,
an input terminal of the third inverter circuit and an output terminal of the fourth inverter circuit being connected to an output terminal of the third C-element circuit.

9. The flip-flop circuit as set forth in claim 8, further comprising:
a delay circuit,
the input data being supplied to the second master latch circuit via the delay circuit.

10. A semiconductor device comprising:
a flip-flop circuit recited in claim 9.

11. The flip-flop circuit as set forth in claim 8, wherein:
a first node is a node which connects an inverted output terminal of the first master latch circuit and one of input terminals of the first C-element circuit to each other;
a second node is a node which connects an inverted output terminal of the second master latch circuit and the other one of input terminals of the first C-element circuit to each other;
a third node is a node which connects the output terminal of the second C-element circuit, the output terminal of the first inverter circuit, the input terminal of the second inverter circuit, and the data input terminal of the second slave latch circuit to each other;
a fourth node is a node which connects a non-inverted output terminal of the first master latch circuit and one of input terminals of the second C-element circuit to each other;
a fifth node is a node which connects a non-inverted output terminal of the second master latch circuit and the other one of input terminals of the second C-element circuit to each other;
a sixth node is a node which connects the output terminal of the first C-element circuit, the input terminal of the first inverter circuit, the output terminal of the second inverter circuit, and the data input terminal of the first slave latch circuit to each other;
a seventh node is a node which connects an inverted output terminal of the first slave latch circuit and one of input terminals of the third C-element circuit to each other;
an eighth node is a node which connects an inverted output terminal of the second slave latch circuit and the other one of input terminals of the third C-element circuit to each other;
a ninth node is a node which connects the output terminal of the third inverter circuit and the input terminal of the fourth inverter circuit;
a distance between any two of the first node, the second node, and the third node is not less than 0.86 µm;
a distance between any two of the fourth node, the fifth node, and the sixth node is not less than 0.86 µm; and
a distance between any two of the seventh node, the eighth node, and the ninth node is not less than 0.86 µm.

12. A semiconductor device comprising:
a flip-flop circuit recited in claim 11.

13. A semiconductor device comprising:
a flip-flop circuit recited in claim 8.

14. An electronic device comprising:
a semiconductor device recited in claim 13.

15. A flip-flop circuit for retaining input data, comprising:
a first master latch circuit for latching the input data;
a second master latch circuit for latching the input data;
a first C-element circuit for receiving an inverted output of the first master latch circuit and an inverted output of the second master latch circuit;
a second C-element circuit for receiving a non-inverted output of the first master latch circuit and a non-inverted output of the second master latch circuit;
a first slave latch circuit for latching an output of the first C-element circuit;
a second slave latch circuit for latching an output of the second C-element circuit;
a fourth C-element circuit for receiving a non-inverted output of the first slave latch circuit and a non-inverted output of the second slave latch circuit;
a first inverter circuit;
a second inverter circuit being interconnected to the first inverter circuit;
a third inverter circuit; and
a fourth inverter circuit being interconnected to the third inverter circuit,
an input terminal of the first inverter circuit and an output terminal of the second inverter circuit being connected to a connection point between an output terminal of the first C-element circuit and a data input terminal of the first slave latch circuit,
an output terminal of the first inverter circuit and an input terminal of the second inverter circuit being connected to a connection point between an output terminal of the second C-element circuit and a data input terminal of the second slave latch circuit, an output terminal of the third inverter circuit and an input terminal of the fourth inverter circuit being connected to an output terminal of the fourth C-element circuit.

16. The flip-flop circuit as set forth in claim 15, further comprising:

a delay circuit, the input data being supplied to the second master latch circuit via the delay circuit.

17. A semiconductor device comprising:

a flip-flop circuit recited in claim 16.

18. The flip-flop circuit as set forth in claim 15, wherein:

a first node is a node which connects an inverted output terminal of the first master latch circuit and one of input terminals of the first C-element circuit to each other;

a second node is a node which connects an inverted output terminal of the second master latch circuit and the other one of input terminals of the first C-element circuit to each other;

a third node is a node which connects the output terminal of the second C-element circuit, the output terminal of the first inverter circuit, the input terminal of the second inverter circuit, and the data input terminal of the second slave latch circuit to each other;

a fourth node is a node which connects a non-inverted output terminal of the first master latch circuit and one of input terminals of the second C-element circuit to each other;

a fifth node is a node which connects a non-inverted output terminal of the second master latch circuit and the other one of input terminals of the second C-element circuit to each other;

a sixth node is a node which connects the output terminal of the first C-element circuit, the input terminal of the first inverter circuit, the output terminal of the second inverter circuit, and the data input terminal of the first slave latch circuit to each other;

a tenth node is a node which connects a non-inverted output terminal of the first slave latch circuit and one of input terminals of the fourth C-element circuit to each other;

an eleventh node is a node which connects a non-inverted output terminal of the second slave latch circuit and the other one of input terminals of the fourth C-element circuit to each other;

a twelfth node is a node which connects the input terminal of the third inverter circuit and the output terminal of the fourth inverter circuit to each other;

a distance between any two of the first node, the second node, and the third node is not less than 0.86 μm;

a distance between any two of the fourth node, the fifth node, and the sixth node is not less than 0.86 μm; and a distance between any two of the tenth node, the eleventh node, and the twelfth node is not less than 0.86 μm.

19. A semiconductor device comprising:

a flip-flop circuit recited in claim 18.

20. A semiconductor device comprising:

a flip-flop circuit recited in claim 15.

* * * * *